(12) United States Patent
Kneissl et al.

(10) Patent No.: US 6,448,102 B1
(45) Date of Patent: Sep. 10, 2002

(54) METHOD FOR NITRIDE BASED LASER DIODE WITH GROWTH SUBSTRATE REMOVED

(75) Inventors: Michael A. Kneissl, Sunnyvale; David P. Bour, Cupertino; Ping Mei, Palo Alto; Linda T. Romano, Sunnyvale, all of CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/277,328

(22) Filed: Mar. 26, 1999

Related U.S. Application Data

(63) Continuation-in-part of application No. 09/223,112, filed on Dec. 30, 1998.

(51) Int. Cl.[7] .............................................. H01L 21/00
(52) U.S. Cl. ............................. 438/46; 438/29; 438/33
(58) Field of Search ........................... 438/458, 46, 29, 438/33, 68, 455, 459, 967, 977, 464, 93, 94; 372/46, 50; 257/190

(56) References Cited

U.S. PATENT DOCUMENTS

| | | | | |
|---|---|---|---|---|
| 4,469,527 A | * | 9/1984 | Sugano et al. | 148/15 |
| 5,642,373 A | * | 6/1997 | Kamizato et al. | 372/50 |
| 5,880,491 A | * | 3/1999 | Soref et al. | 257/190 |
| 5,985,687 A | * | 11/1999 | Bowers et al. | 438/46 |
| 6,071,795 A | * | 6/2000 | Cheung et al. | 438/458 |
| 6,072,818 A | * | 6/2000 | Hayakawa | 372/46 |

FOREIGN PATENT DOCUMENTS

| | | | |
|---|---|---|---|
| JP | 57210635 | * 12/1982 | 21/32 |

OTHER PUBLICATIONS

A. Kuramata, S. Kubota, R. Soejima, K. Domen, K. Horino and T. Tanahashi. "Room–Temperature Continuous Wave Operation of InGaN Laser Diodes with Vertical Conducting Structure on SiC Substrate". Japanese Journal of Applied Physics, vol. 37, Part 2, No. 11B, Nov. 15, 1998, pp. L1373–L1375.

S. Nakamura, M. Senoh, S. Nagahama, N. Iwasa, T. Yamada, T. Matsushita, H. Kiyoku, Y. Sugimoto, T. Kozaki, H. Umemoto, M. Sano and K. Chocho. "Continuous–wave operation of InGaN/GaN/AlGaN–based laser diodes grown on GaN substrates". Applied Physics Letters, vol. 72, No. 16, Apr. 10, 1998, pp. 2014–2016.

S. Nakamura, M. Senoh, S. Nagahama, N. Iwasa, T. Yamada, T. Matsushita, H. Kiyoku, Y. Sugimoto, T. Kozaki, H. Umemoto, M. Sano and K. Chocho. "InGaN/GaN/AlGaN–based laser diodes with modulation–doped strained–layer superlattices grown on an epitaxially laterally overgrown GaN substrate". Applied Physics Letters, vol. 72, No. 2, Jan. 12, 1998, pp. 211–213.

S. Nakamura, G. Fasol. "The Blue Laser Diode. GaN Based Light Emitters and Lasers." Springer, 1997. pp. 34–47, 190–193 & 223–259.

* cited by examiner

Primary Examiner—Olik Chaudhuri
Assistant Examiner—Laura Schillinger

(57) ABSTRACT

A method for placing nitride laser diode arrays on a thermally conducting substrate is described. The method uses an excimer laser to detach the nitride laser diode from the sapphire growth substrate after a thermally conducting substrate has been bonded to the side opposite the sapphire substrate.

12 Claims, 25 Drawing Sheets

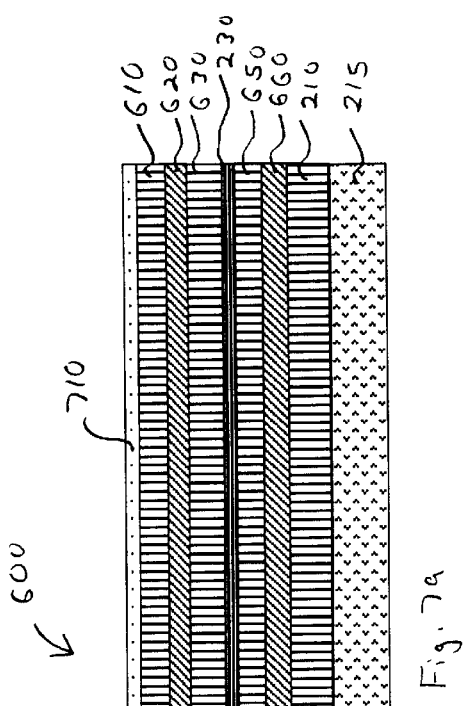
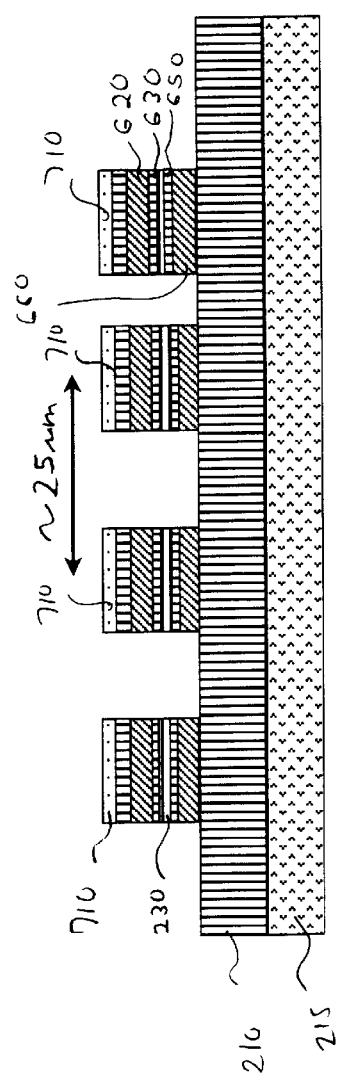
Fig. 7a
Fig. 7b

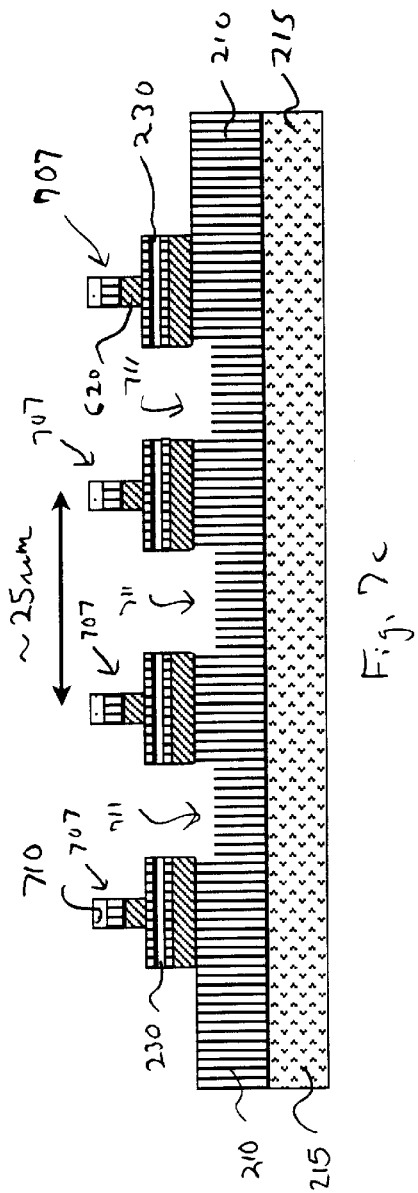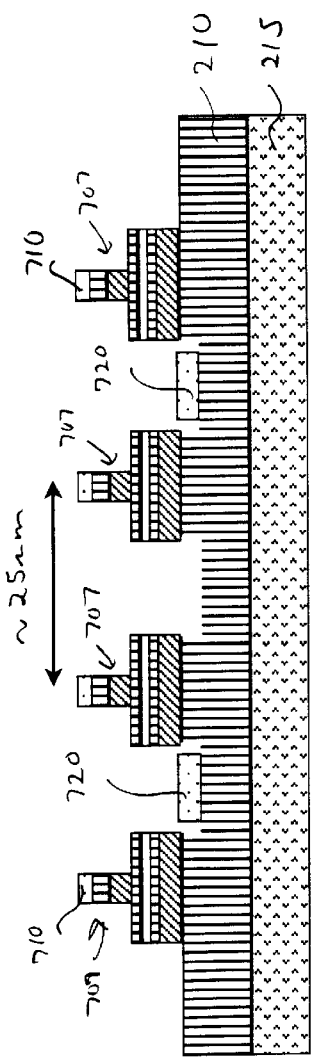

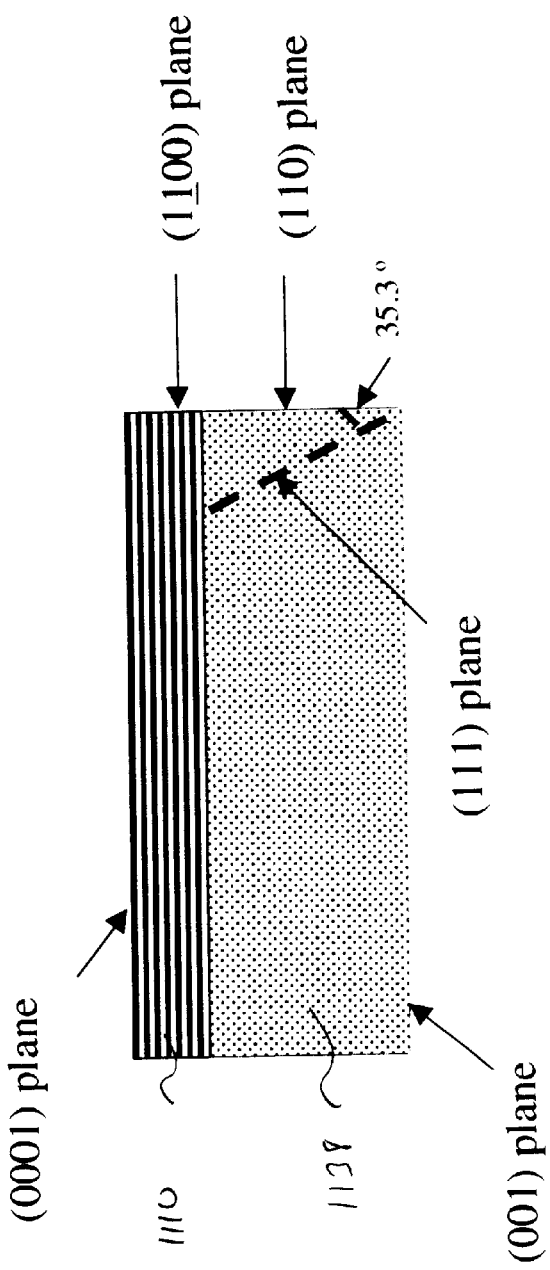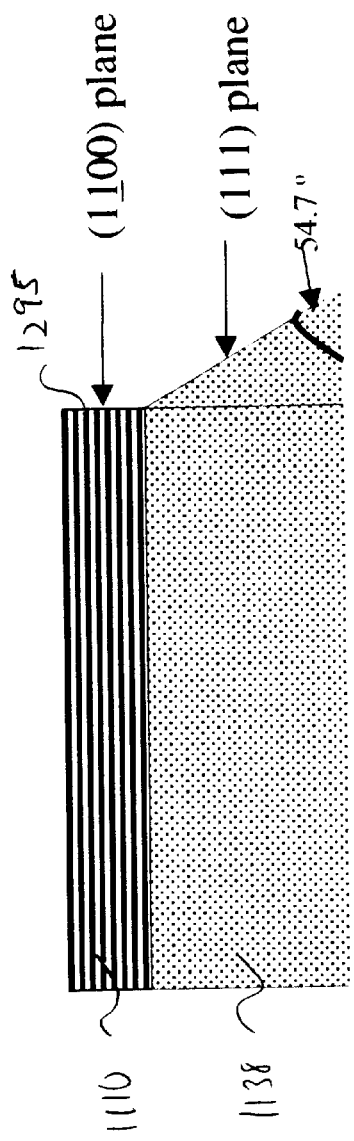
Fig. 12a
Fig. 12b

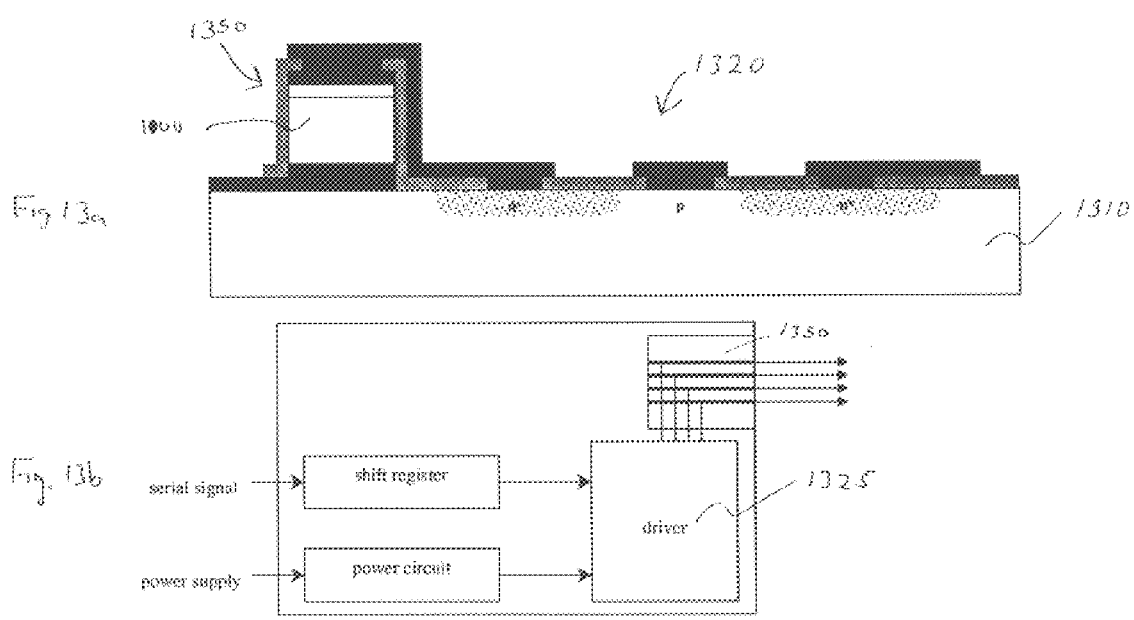

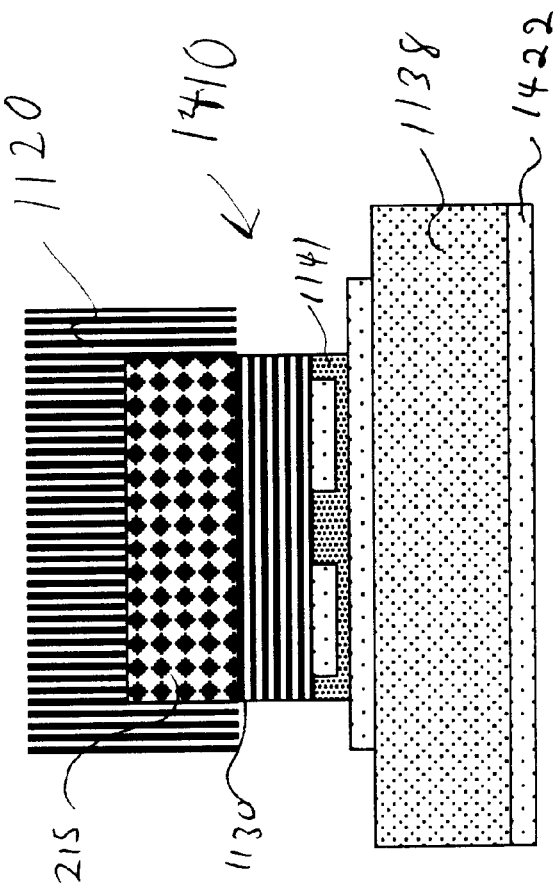
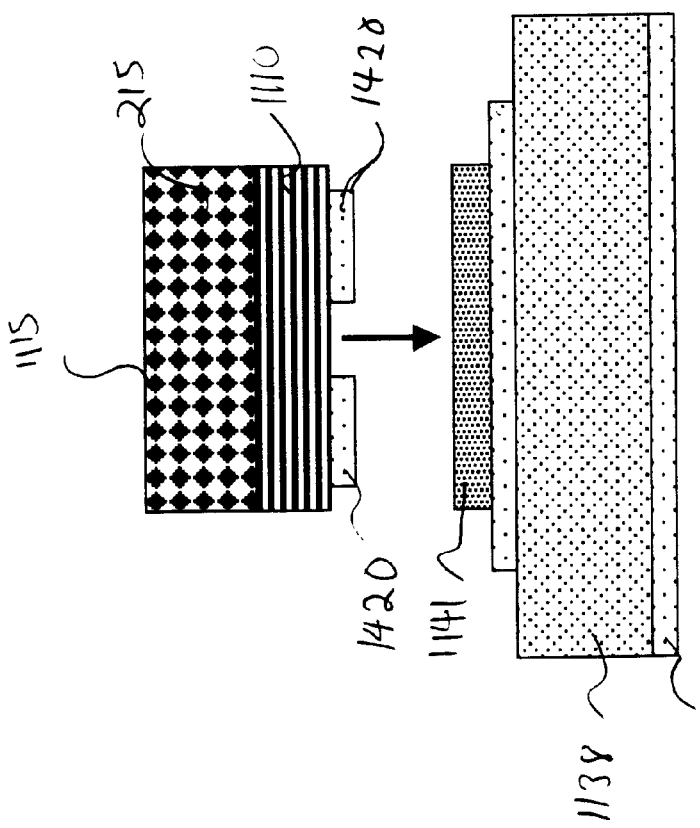
Fig. 14a
Fig. 14b

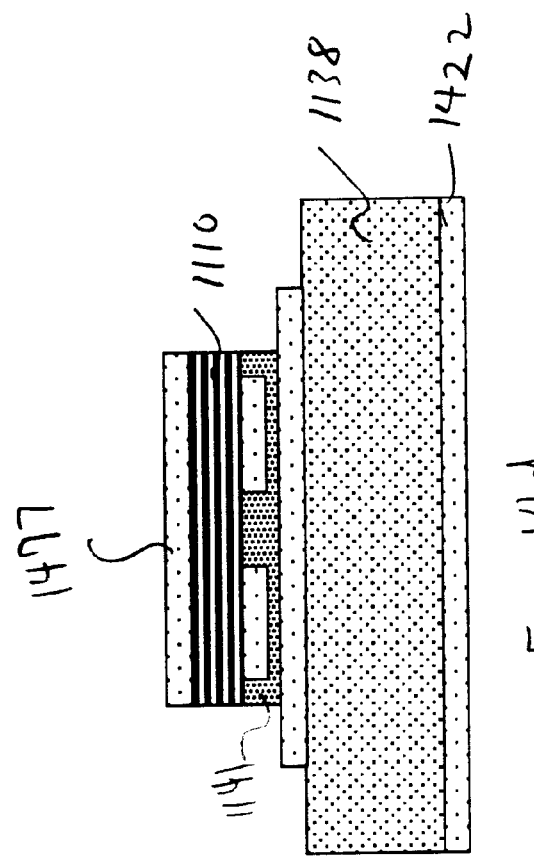
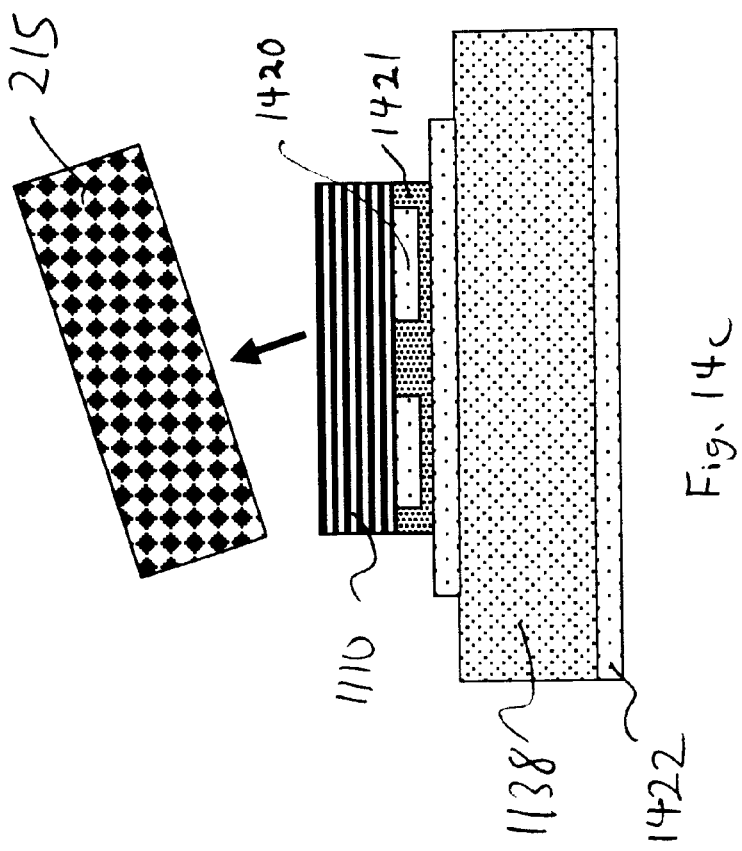
Fig. 14d
Fig. 14c

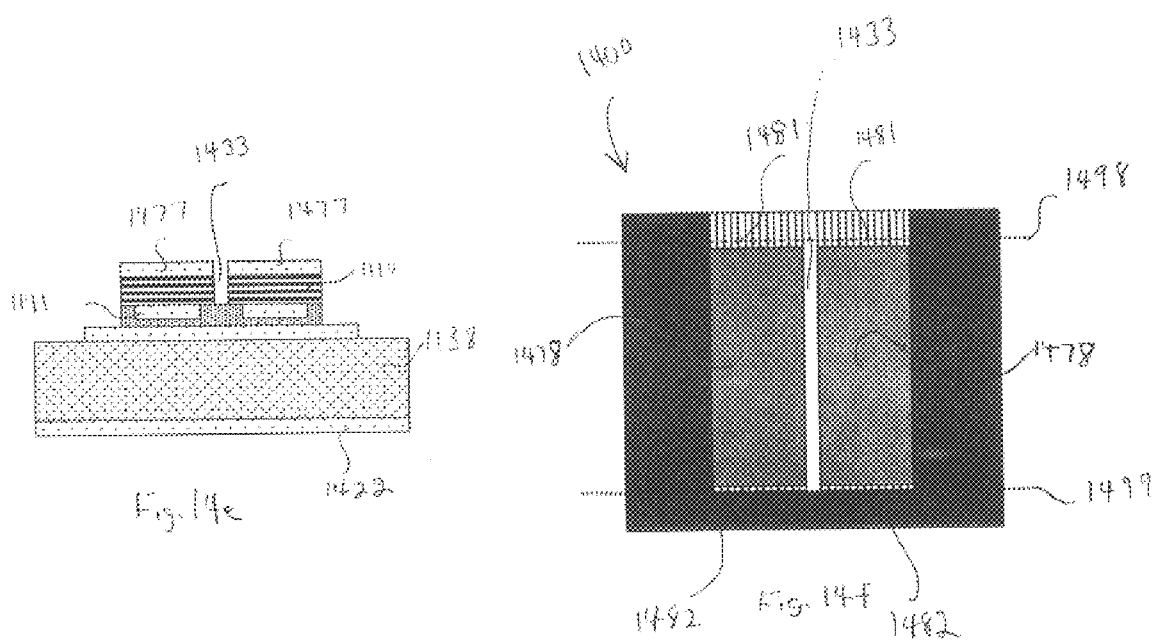

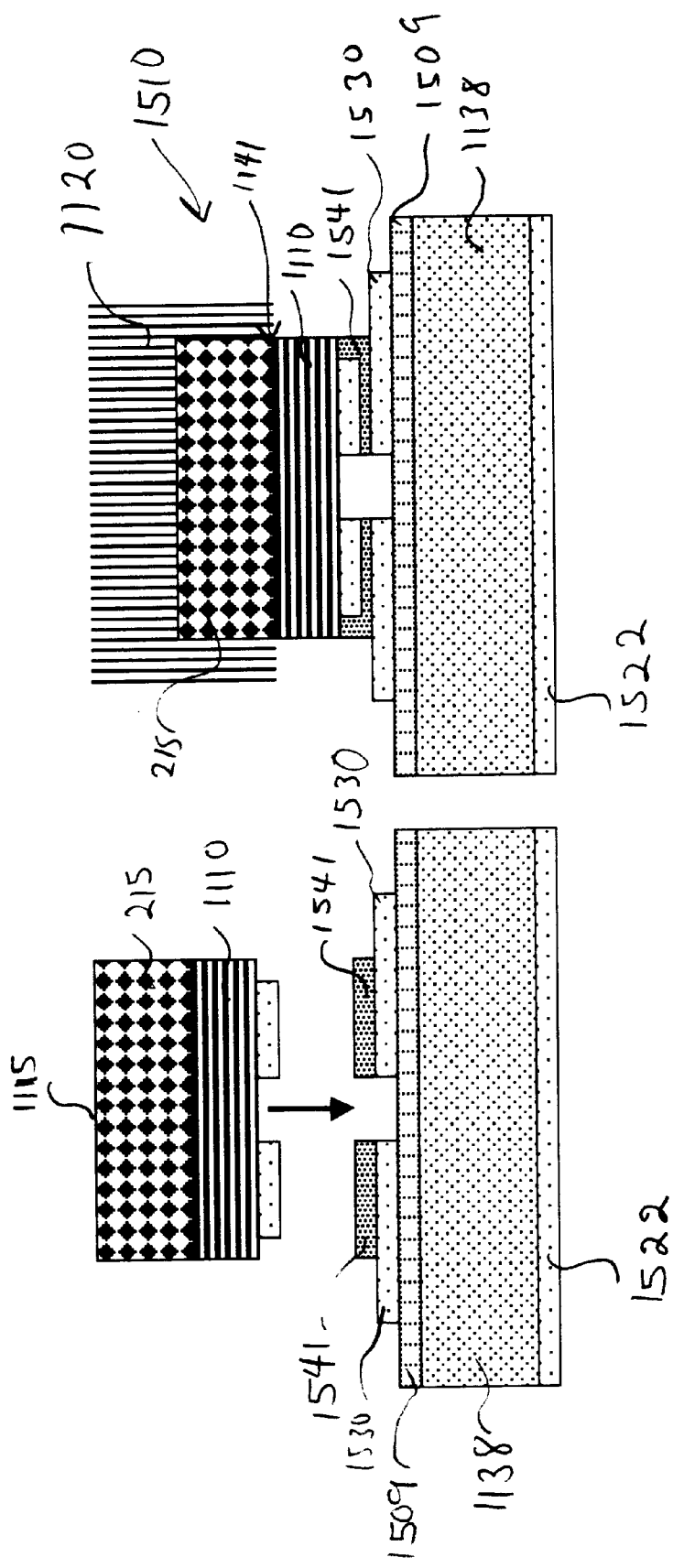

METHOD FOR NITRIDE BASED LASER DIODE WITH GROWTH SUBSTRATE REMOVED

CROSS-REFERENCE TO RELATED APPLICATIONS

The present invention is a continuation-in-part of "Structure for Nitride Based Laser Diode Arrays on an Insulating Substrate", Ser. No. 09/223,112, filed Dec. 30, 1998 and related to applications "Structure for Nitride Based Laser Diode with Growth Substrate Removed" Ser. No. 09/276,913 by Kneissl et al. and "Method for Nitride Based Laser Diode with Growth Substrate Removed Using an Intermediate Substrate" Ser. No. 09/276856 by Kneissl et al., filed on the same day and assigned to the same assignee.

BACKGROUND OF THE INVENTION

The present invention relates generally to the field of laser diodes, and more particularly to architecture for short-wavelength nitride based laser diode arrays.

Short-wavelength nitride based laser diodes provide smaller spot size and a better depth of focus than red and infrared (IR) laser diodes for laser printing operations and other applications. Single-spot nitride laser diodes have applications in areas such as optical storage.

Laser diode arrays are desirable for application to high-speed laser printing. Printing at high speeds and at high resolution requires laser arrays due to the fundamental limits of polygon rotation speed, laser turn-on times and laser power. Laser diode arrays have previously been employed using red and infrared laser diode structures. Dual-spot red lasers and quad-spot infrared lasers have been used for laser printers.

Laser diodes based on higher bandgap semiconductor alloys such as AlGaInN have been developed. Excellent semiconductor laser characteristics have been established in the near-UV to violet spectrum, principally by Nichia Chemical Company of Japan. See for example, A. Kuramata et al., "Room-temperature CW operation of InGaN Laser Diodes with a Vertical Conducting Structure on SiC Substrate", Japanese Journal of Applied Physics, Vol. 37, L1373 (1998), S. Nakamura et al., "CW Operation of InGaN/GaN/AlGaN-based laser diodes grown on GaN substrates", Applied Physics Letters, Vol. 72(6), 2014 (1998) and S. Nakamura and G. Fasol, "The Blue Laser Diode-GaN based Light Emitters and Lasers", (Springer-Verlag, 1997) all of which are incorporated by reference in their entirety.

Extension of dual-spot lasers to shorter wavelengths enables printing at higher resolution. The architecture for short-wavelength laser diode arrays has needed to be different when nitride based laser diodes are used in arrays because mirrors need to be formed by dry etching instead of cleaving and nitride based devices are mostly grown on insulating substrates such as sapphire.

A group from the University of California has developed a technique for separation of GaN films from sapphire substrates using a UV-excimer laser. The University of California technique uses an ultraviolet excimer laser to decompose a thin portion of the GaN layer at the interface with the sapphire substrate. By proper adjustment of the excimer laser flux, the interfacial GaN is decomposed into Ga and N with minimal damage. Subsequently, the GaN film is removed by gentle heating of the remaining Ga metal which has a melting point of 30° C. at the film-substrate interface. See W. S. Wong et al., "Damage-free separation of GaN thin films from sapphire substrates", Applied Physics Letters, Vol. 72, 599 (1998) which is incorporated by reference in its entirety.

SUMMARY OF THE INVENTION

Architectures using insulating substrates allow the economical construction of nitride based quad-spot diode laser and surface-emitting dual-quad-spot laser diode arrays. Currently, most advanced nitride based single laser structures are grown on insulating sapphire ($Al_2O_3$) substrates. The use of insulating substrates for laser diode arrays presents a special problem in providing electrical contacts for the laser diodes. In contrast to the situation where conducting substrates are used, insulating substrates cannot provide a common backside contact for all laser diodes in an array. Hence, providing electrical contacts to laser diode arrays on insulating substrates has required the use of special architectures.

Removal of the insulating substrate after growth of the laser diode array structures simplifies providing electrical contacts to the laser diode arrays and avoids special architectures while allowing a superior heat sink to be attached to the laser diode arrays. The laser diode array may be attached to a thermally conductive wafer before or after substrate removal by soldering, thermo-compression bonding or other means. Attachment of the thermally conductive substrate after removal of the insulating substrate requires the attachment of a support substrate as an intermediate step. Attachment of the thermally conductive wafer to the laser diode array before removal of the insulating substrate allows positioning of the thermally conductive substrate on the side of the laser diode array closer to the laser active region for more effective heat sinking than if the laser diode array is attached to the thermally conductive substrate after removal of the insulating substrate. If the nitride laser membrane is properly aligned during the attachment process with the thermally conductive substrate, cleaved mirror facets may be formed. Cleaved rather than etched mirror facets result in perfectly parallel, vertical, and smooth mirrors.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

FIG. 5a shows a top view of the layout of a dual quad-spot laser diode structure in an embodiment in accordance with the present invention.

FIG. 5b shows a cross-sectional view of the embodiment shown in FIG. 5a.

FIGS. 7a–7e show processing steps for a quad-spot laser diode structure in an embodiment in accordance with the present invention.

FIG. 10 shows a dual spot laser diode structure in an embodiment in accordance with the present invention.

FIG. 12a shows crystal planes of silicon and InGaAlN membrane.

FIG. 12b shows cleaved facets in InGaAlN membrane in an embodiment in accordance with the present invention.

FIGS. 14a–14f show the steps for removing the sapphire substrate and adding a thermally conducting substrate to a dual spot laser structure with common p-contact in an embodiment in accordance with the present invention.

FIGS. 15a–15e show the steps for removing the sapphire substrate and adding a thermally conducting substrate to a dual spot laser structure with common n-contact in an embodiment in accordance with the present invention.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Laser Diode Arrays on an Insulating Substrate

Figure 1:
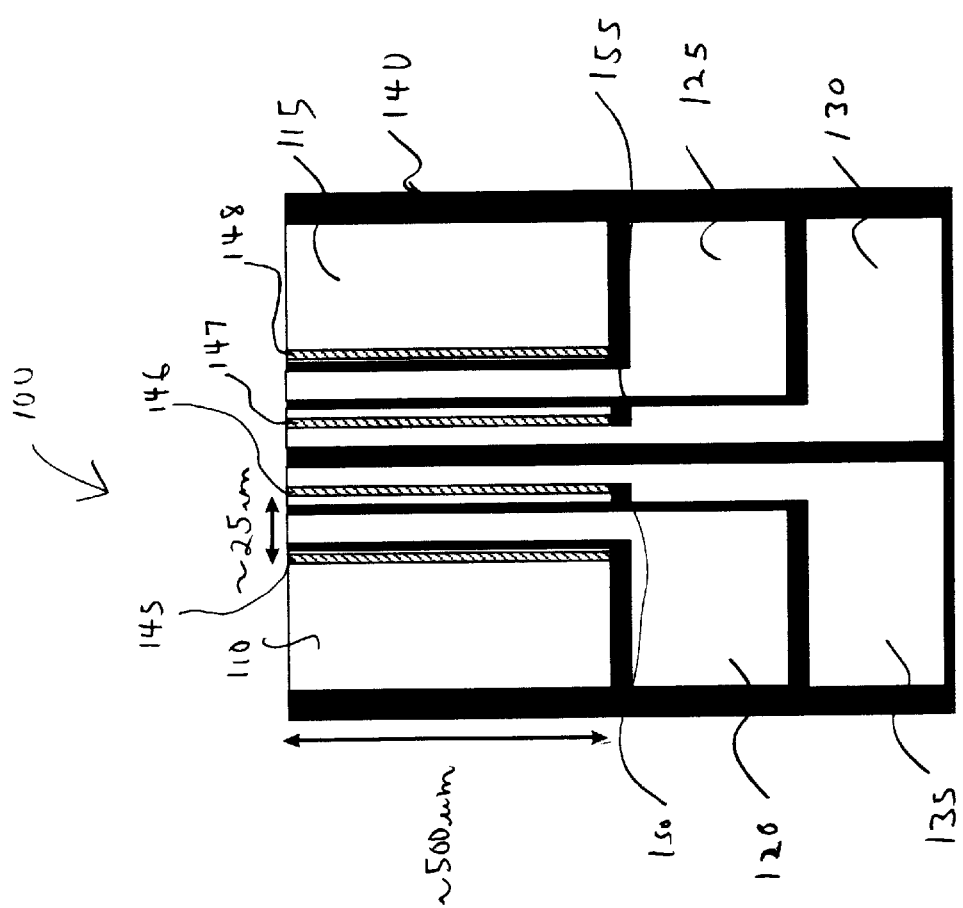
FIG. 1 shows a top view of the layout of a quad-spot laser diode structure in an embodiment in accordance with the present invention.

An embodiment in accordance with the present invention is shown in FIG. 1. FIG. 1 shows quad-spot InGaAlN laser diode structure 100 typically grown on $Al_2O_3$ insulating substrate 215 (see FIG. 2). Structure 100 shows laser diodes 145 and 146 sharing n metal contact 120 and laser diodes 147 and 148 sharing n-metal contact 125. P-metal contact 110 connects to laser diode 145, p-metal contact 135 connects to laser diode 146, p-metal contact 130 connects to laser diode 147 and p-metal contact 115 connects to laser diode 148. The lateral separation between adjacent laser diodes shown in FIG.1 is about 25 $\mu$m. For example, the separation between laser diodes 145 and 146 is about 25 $\mu$m. The length of laser diode structures 145, 146, 147 and 148 is typically about 500 $\mu$m. Isolation layer 140 is made of a dielectric material, typically, silicon oxy-nitride, silicon dioxide, silicon nitride or polyimide. Notches 150 and 155 in p-metal contacts 135 and 130, respectively, provide open space for subsequent evaporation of a dielectric high reflective coating, for example, $TiO_2/SiO_2$.

Figure 2:
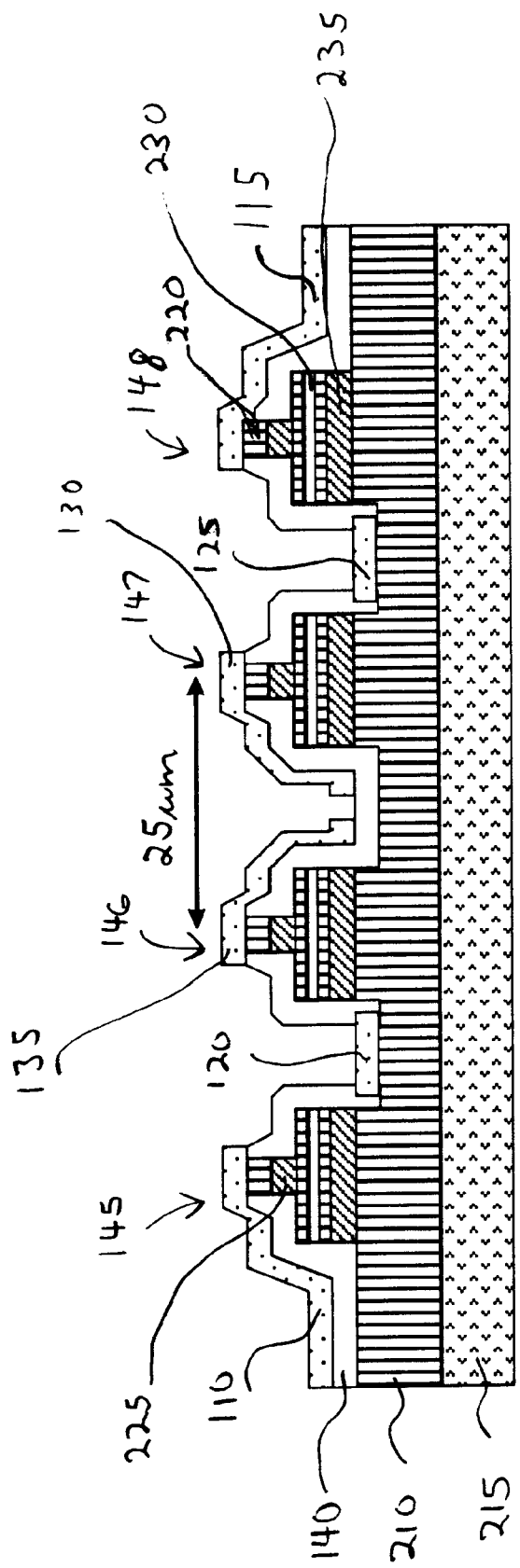
FIG. 2 shows a cross-sectional view of the embodiment in FIG. 1.

FIG. 2 shows a cross-sectional view of quad-spot InGaAlN laser diode structure 100. P-GaN cap layer 220 is positioned atop p-AlGaN cladding layer 225. The active region is InGaN layer 230 that has a multi-quantum well structure and is positioned on n-AlGaN cladding layer 235. Layer 210 is n-GaN and resides on insulating substrate 215 which is typically $Al_2O_3$.

Figure 3:
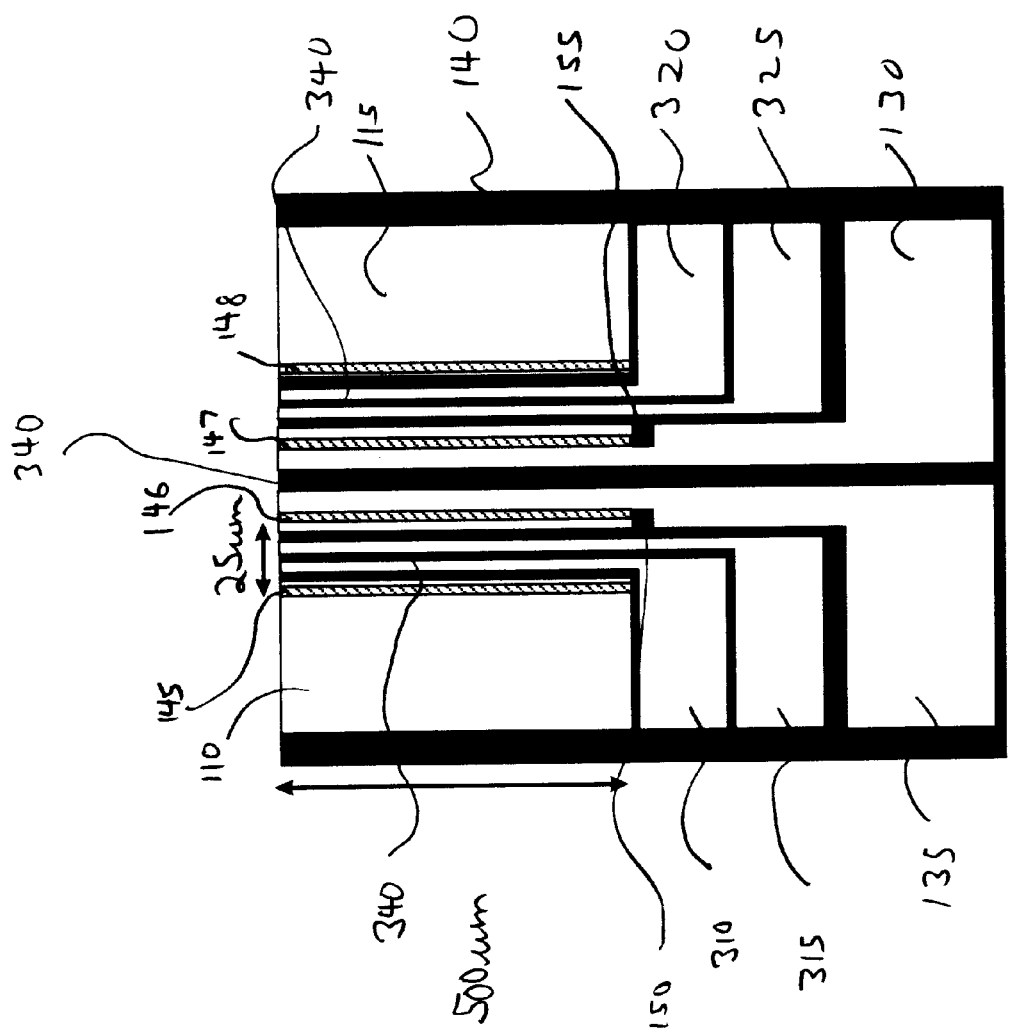
FIG. 3 shows a top view of the layout of a quad-spot laser diode structure in an embodiment in accordance with the present invention

FIG. 3 shows an alternative quad-spot InGaAlN laser diode structure 300 typically grown on $Al_2O_3$ insulating substrate 215 (see FIG. 2). Quad-spot InGaAlN laser diode structure 300 is similar to quad-spot InGaAlN laser diode structure 100 shown in FIG. 1 except that separate n-metal contacts 310, 315, 320 and 325 are provided for laser diode structures 145, 146, 147 and 148, respectively. Providing separate n- and p- metal contacts for each device minimizes electrical and thermal crosstalk. Additional reduction in crosstalk can be achieved by etching very deep isolation grooves 340 (see FIG. 3) to separate laser diode 145 from laser diode 146, to separate laser diode 146 from laser diode 147 and to separate laser diode 147 from laser diode 148. Isolation grooves 340 may penetrate down to insulating substrate 215 (see FIG. 2) but at a minimum, grooves 340 should penetrate below active region 230. This eliminates optical crosstalk and the electrical crosstalk caused by diffusion of injected carriers within active region 230.

Figure 4:
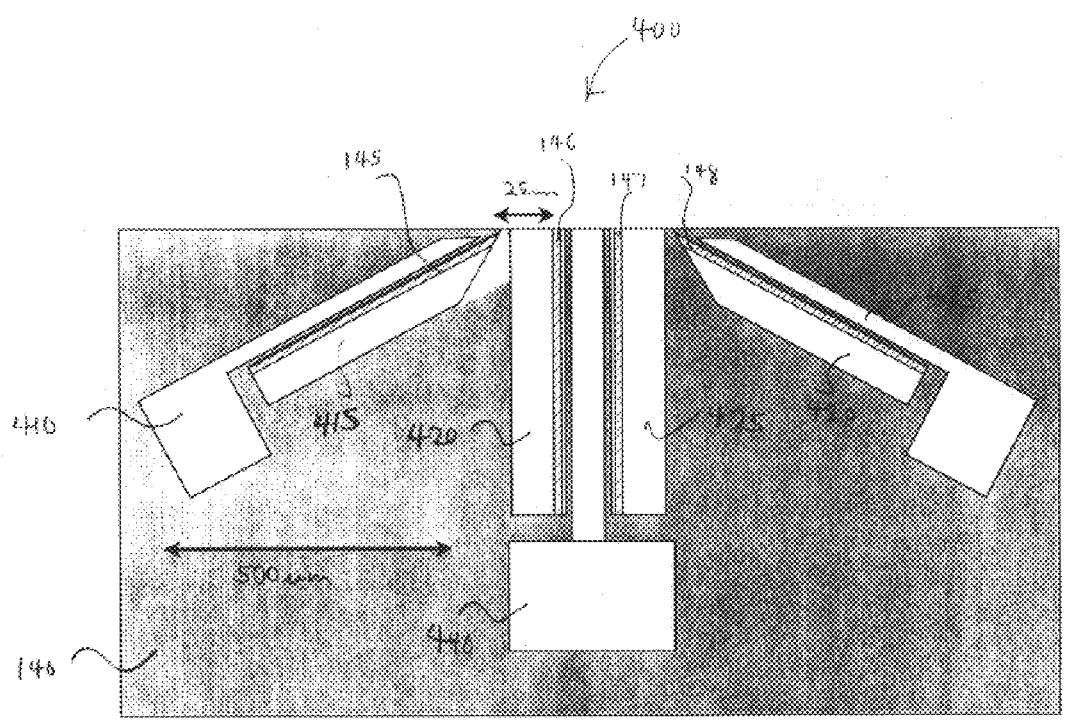
FIG. 4 shows a top view of the layout of a quad-spot laser diode structure in an embodiment in accordance with the present invention.

An embodiment in accordance with the present invention is shown in FIG. 4. Quad-spot InGaAlN laser diode structure 400 is grown on insulating substrate 215. Laser diodes 145 and 148 and associated n-metal and p-metal contacts 410, 435 and 415, 430, respectively, are aligned at an angle to provide more separation from laser diodes 146 and 147. The angle is chosen so that the resulting separation achieves a further reduction in electrical and especially thermal crosstalk. Laser diode 145 is provided electrical contact using n-metal contact 410 and p-metal contact 415 and laser diode 148 is provided electrical contact using n-metal contact 435 and p-metal contact 430. Laser diode 146 is provided electrical contact using p-metal contact 420 and n-metal contact 440. N-metal contact 440 is shared with laser diode 147 which has separate p-metal contact 425. N-metal contact 440 may be divided into two separate contacts to provide separate n-metal contacts to laser diodes 146 and 147 for a further reduction of electrical and thermal crosstalk.

Figure 5:
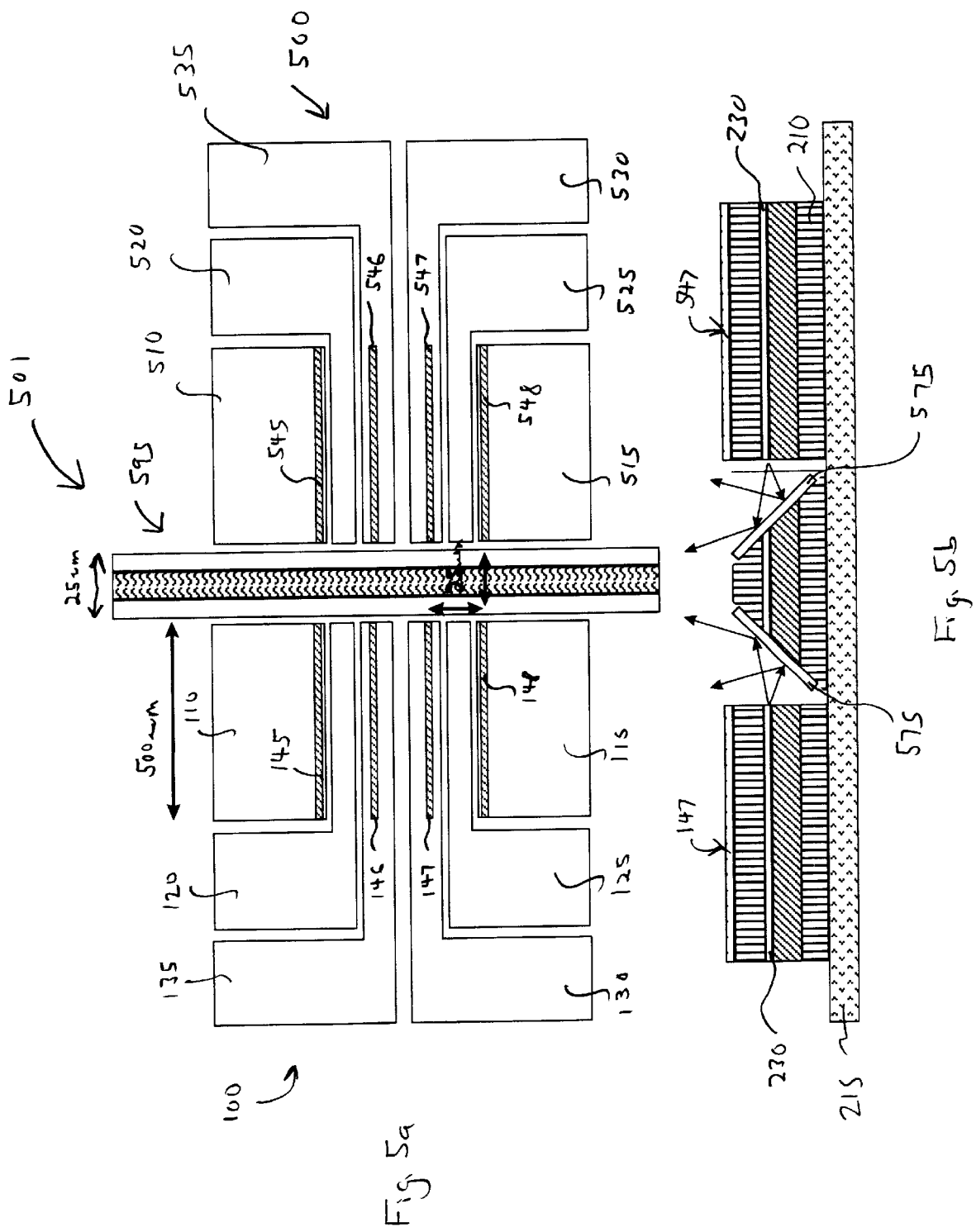

An embodiment in accordance with this invention of dual-quad-spot laser diode structure 501 is shown in FIGS. 5a and 5b. FIG. 5a shows the placement of quad-spot laser diode structure 100 on one side of channel structure 595 and corresponding mirror image laser diode structure 500 on the other side of channel structure 595 resulting in dual-quad-spot laser diode structure 501. Structure 500 has laser diodes 545 and 546 sharing n metal contact 520 and laser diodes 547 and 548 sharing n-metal contact 525. P-metal contact 510 connects to laser diode 545, p-metal contact 535 connects to laser diode 546, p-metal contact 530 connects to laser diode 547 and p-metal contact 515 connects to laser diode 548. The lateral separation between adjacent laser diodes shown in FIG. 1 is about 25 $\mu$m. For example, the separation between laser diodes 545 and 546 is about 25 $\mu$m. The length of laser diode structures 545, 546, 547 and 548 is typically about 500 $\mu$m. Structure 100 has been described above with reference to FIGS. 1 and 2.

FIG. 5b shows a cross-section of dual-quad-spot laser diode structure 501 along laser diode structures 147 and 547 and channel structure 595. Channel structure 595 contains tilted mirrors 575 (see FIG. 5b) for outcoupling light from laser diodes 145, 146, 147, 148, 545, 546, 547 and 548 into the vertical direction. Aluminum coated mirrors 575 are dry etched using, for example, chemically assisted ion-beam etching (CAIBE) and the inclination angle may be adjusted by varying etching parameters. A suitable inclination angle for mirror facets 575 in FIG. 5b is 45 degrees . The architecture shown in FIGS. 5a and 5b allows a closely spaced dual-quad-spot laser diode structure to be achieved. The spacing between adjacent laser diodes such as laser diodes 145 and 146 or 545 and 546 is typically 25 $\mu$m.

Figure 6:
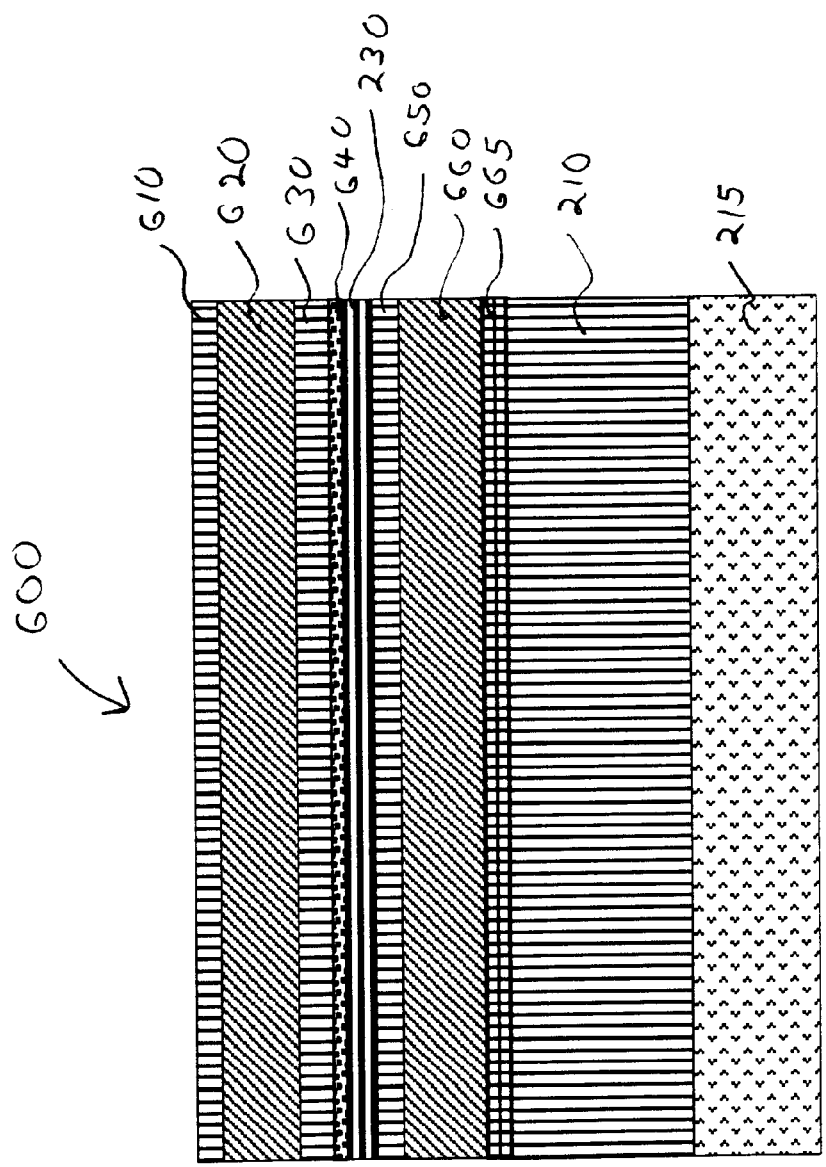
FIG. 6 shows the layers of a quad-spot laser diode structure in an embodiment accordance with the present invention.

In an embodiment in accordance with this invention, FIG. 6 shows InGaAlN heterostructure wafer 600 grown by metalorganic chemical vapor deposition (MOCVD) on insulating substrate 215. Insulating substrate 215 is typically $Al_2O_3$ and has a thickness typically ranging on the order of 100 $\mu$m to 400 $\mu$m. GaN:Mg cap layer 610 is 0.1 $\mu$m thick and adjoins $Al_{0.08}Ga_{0.92}N$:Mg cladding layer 620 which has a typical thickness in the range of 0.5 to 1.0 $\mu$m. Note that Mg is added to produce a p-type conductivity. A second GaN:Mg layer 630 also 0.1 $\mu$m thick lies underneath cladding layer 620 and serves as an p-doped waveguide. $Al_{0.2}Ga_{0.8}N$:Mg layer 640 is typically 20 nm thick and serves to create a tunnel barrier to prevent leakage of injected electrons. GaN:Si layer 650 functions as an n-doped waveguide for active region 230. Note that Si is added to produce an n-type conductivity. $Al_{0.08}Ga_{0.92}N$:Si cladding layer 660 has a typical thickness from 0.5 to 1.5 $\mu$m. $In_{0.03}Ga_{0.97}N$:Si layer 665 has a typical thickness of 50 nm and functions as a defect reducing layer.

GaN:Si layer 210 with a typical thickness of 4 $\mu$m lies above insulating substrate 215 and serves to establish a good quality material for subsequent depositions and to provide a lateral contact layer. Further details may be found in Nakamura and Fasol incorporated by reference above. Once structure 600 has been grown by MOCVD activation of Mg p-doping is performed in (Al)GaN:Mg layers 610, 620, 630 and 640. Activation of dopants is accomplished by rapid thermal annealing at 850° C. for 5 minutes in $N_2$ ambient.

Figure 7E:
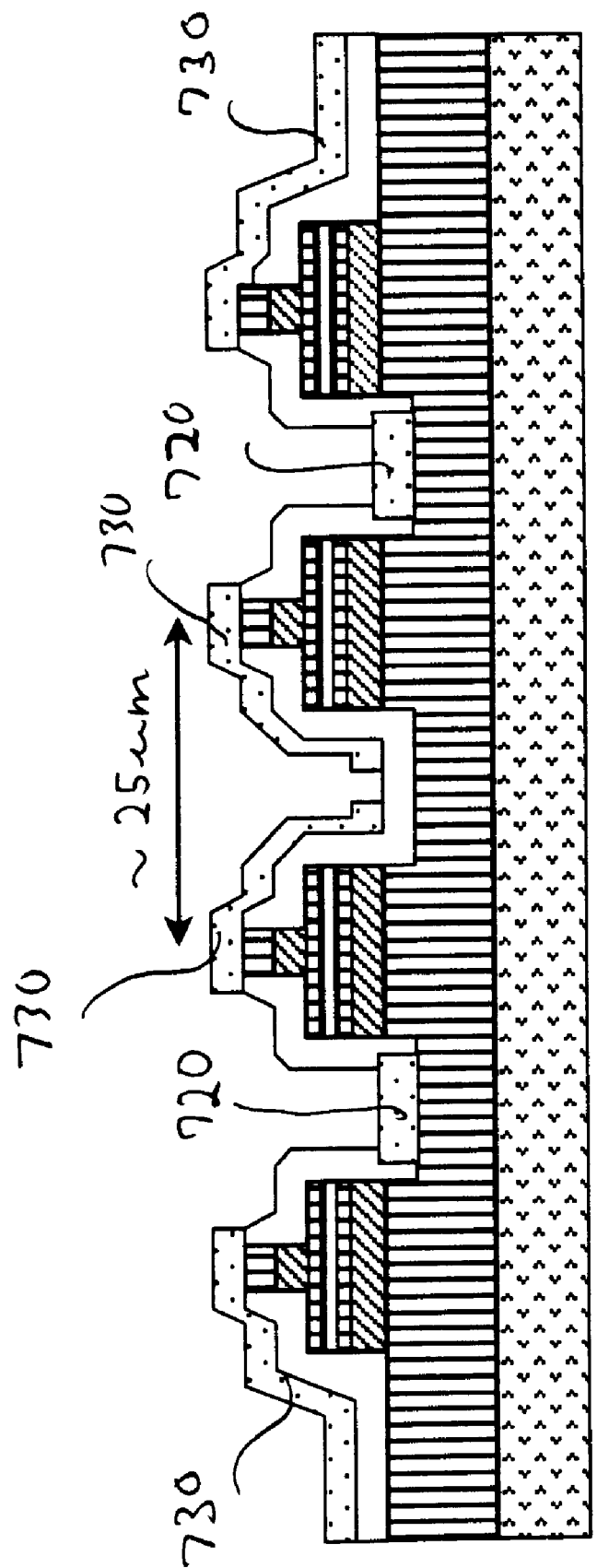

FIGS. 7a –7a show the major processing steps for a quadspot ridge waveguide laser diode structure in accordance with this invention. Note that layers 640 and 665 are not shown in FIGS. 7a–7e. FIG. 7a shows wafer 600 after p-metal deposition. P-metal layer 710 is typically nickel-gold (Ni-Au) and deposited using thermal evaporation and rapid thermal annealing in an $N_2$ ambient. Dry etching is performed using CAIBE or reactive ion etching (RIE) to etch the mesa structure shown in FIG. 7b in an $Ar/Cl_2/BCl_3$ gas mixture. The mirrors (not shown) are also dry etched using a CAIBE or RIE process. FIG. 7c shows wafer 600 after etching of ridge waveguides 707 and trenches 711 in an $Ar/Cl_2/BCl_3$ gas mixture using CAIBE or RIE. FIG. 7d shows the result of depositing n-metal 720 which is typically titanium-aluminum (Ti-Al) using thermal evaporation and rapid thermal annealing in a $N_2$ ambient.

Dielectric isolation deposition is then performed using plasma enhanced chemical vapor deposition (PECVD) using, for example, silicon-oxy-nitride, silicon oxide or silicon nitride as the dielectric. Polyimide may also be used as the dielectric. Contact windows are opened in dielectric isolation layer 755 using radio frequency (RF) plasma etching in $CF_4/O_2$ ambient prior to deposition of titanium/gold p-metal contact pads using thermal evaporation. FIG. 7e shows wafer 600 after p-metal contact pad 730 and n-metal contact pad 720 deposition. Substrate 215 is then thinned by mechanical polishing to prepare wafer 600 for cleaving of laser diodes into individual devices. A final step involves using electron beam evaporation for deposition of a $SiO_2/TiO_2$ high reflective coating on the front and backside of the laser diode mirrors (not shown) to reduce the laser threshold current and protect the mirror surfaces.

Figure 8A:
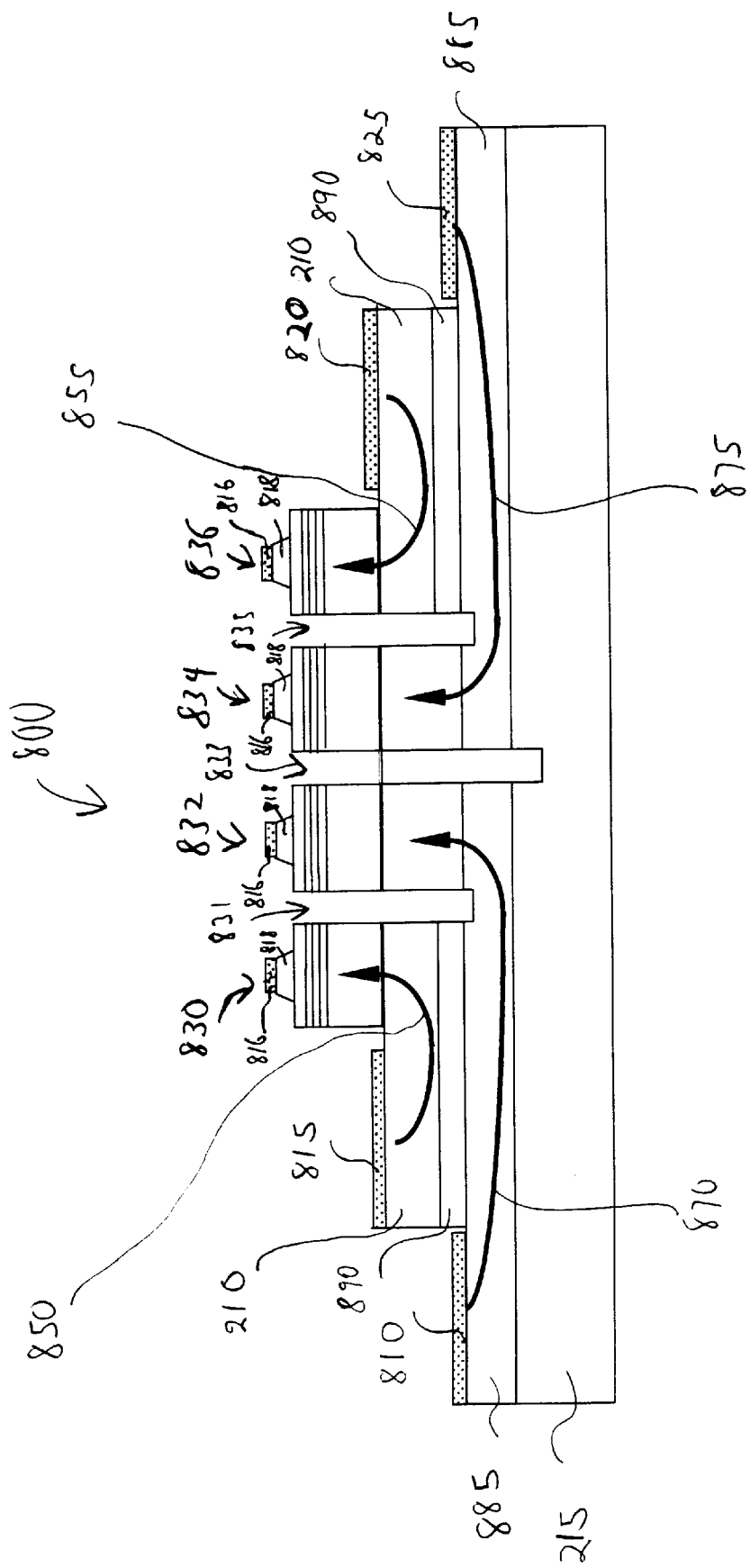
FIG. 8a shows a quad-spot laser diode structure in an embodiment in accordance with the present invention.

FIG. 8a shows an embodiment in accordance with the present invention of quadspot laser diode structure 800 built on insulating substrate 215 using GaN/AlGaN. Quadspot laser diode structure 800 uses n-GaN buried layer 210 separated from n-GaN buried layer 885 by p-GaN or AlGaN blocking layer 890 to form buried current channels 850 and 855. Buried current channels 850 and 855 go from n-metal contacts 815 and 820 to contact laser diodes 830 and 836, respectively. Buried current channels 870 and 875 go from n-metal contacts 810 and 825 to contact laser diodes 832 and 834, respectively, using n-GaN buried layer 885 which is sandwiched between p-GaN or AlGaN blocking layer 890 and insulating substrate 215. Typically, insulating substrate 215 is made of $Al_2O_3$. Laser diode pairs 830, 832; 832, 834; and 834, 836 are separated from each other both optically and electrically by grooves 831, 833 and 835, respectively. Groove 833 is etched down through lowest GaN layer 885 while grooves 831 and 835 are etched only through p-GaN layer 890 to allow current to flow to inner laser diodes 832 and 834, respectively. GaN or AlGaN layer 890 may be made an insulating layer if desired.

Figure 8B:
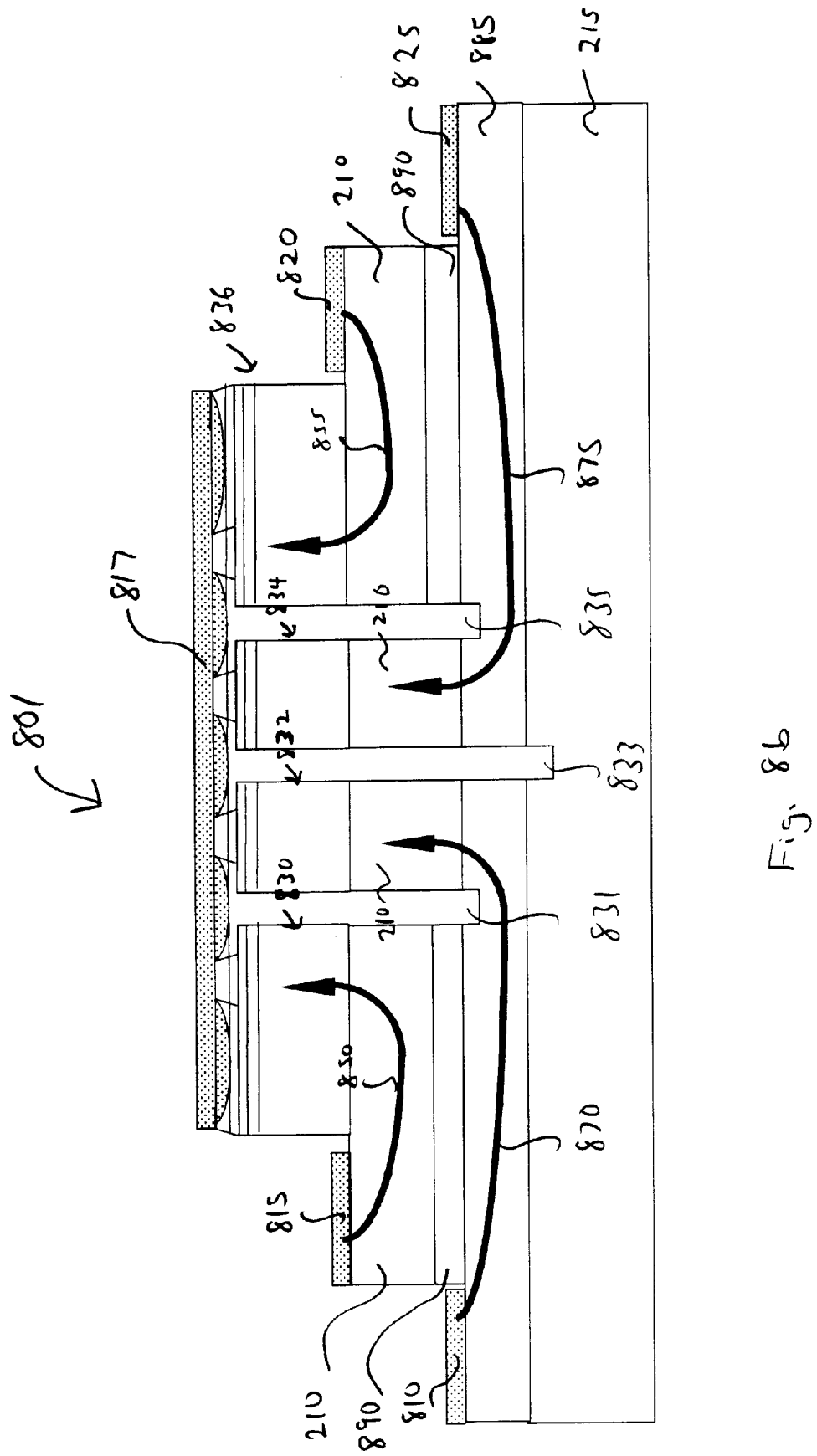
FIG. 8b shows a quad-spot laser diode structure in an embodiment in accordance with the present invention.

P-metal contact pads 816 can be arranged in several different ways as shown above in FIGS. 1–5. In FIG. 8a, individually addressable p-metal contact pads 816 are connected to laser diodes 830, 832, 834 and 836 through a window (not shown) in isolation layer (not shown) applied to p-AlGaN cladding layer 225. An alternative embodiment in accordance with the present invention is shown in FIG. 8b. FIG. 8b shows quadspot laser diode structure 801 having common p-metal contact 817 formed by filling grooves 831, 833 and 835 and areas surrounding p-GaN contact layer 818 (FIG. 8a) with an insulator such as polyimide. Addressability of individual laser diodes 830, 832, 834 and 836 is preserved through n-metal contacts 815, 810, 825 and 820, respectively. The common p-metal contact structure can be extended to more than four closely spaced laser diodes by the addition of a pair of n- and p- GaN layers for every two laser diodes added to laser diode structure 801 shown in FIG. 8b.

For some laser diode driver circuits it is more convenient to have a common n-metal contact structure for quadspot laser diode structure 801. This is readily achieved by reversal of the polarities of all layers (see FIG. 9) in quadspot laser diode structure 801. This makes buried current channels 850, 855, 870 and 875 p-type channels. However, this arrangement is not presently preferred for nitride based lasers because carrier mobility and achievable doping levels in p-type GaN are significantly lower than in n-type GaN.

Figure 9:
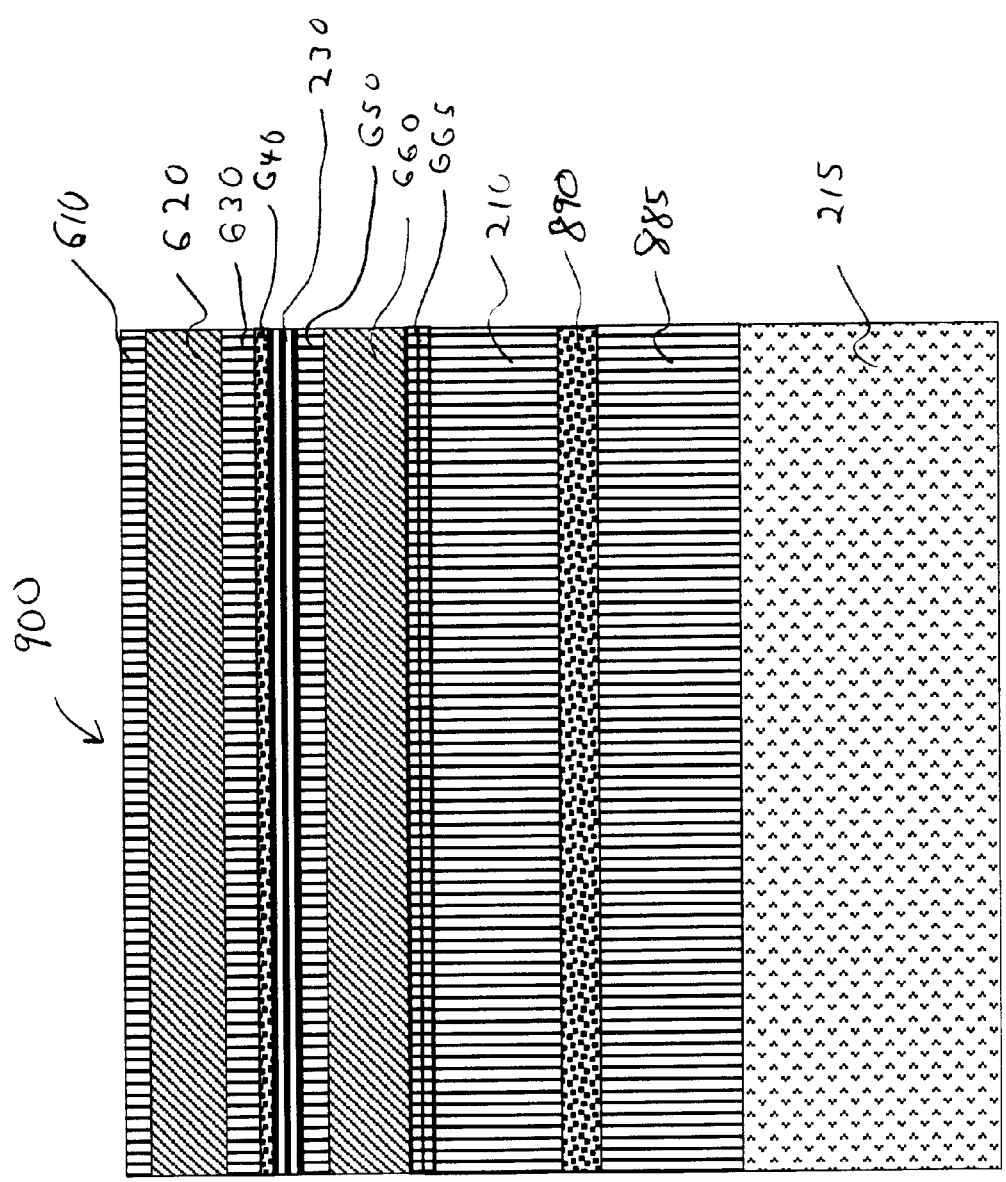
FIG. 9 shows the layers of a quad-spot laser diode structure in an embodiment in accordance with the present invention.

In an embodiment in accordance with this invention, FIG. 9 shows InGaAlN heterostructure wafer 900 grown by metalorganic chemical vapor deposition (MOCVD) on insulating substrate 215. The layer structure of wafer 900 is identical to wafer 600 of FIG. 6 except for the addition of p-(Al)GaN:Mg isolation layer 890, typically several hundred nm in thickness and second n-GaN:Si layer 885, typically at least 1–2 $\mu$m in thickness. Isolation layer 890 can also be grown as an insulator since its purpose is to provide electrical isolation of GaN layer 885 from GaN layer 210. Following growth of n-GaN layer 885 and p-GaN isolation layer 890, wafer 900 is removed from the growth reactor and isolation layer 890 is selectively removed in the regions where laser diodes 832 and 834 (see FIG. 8a) will be located. After selective removal of isolation layer 890, etched wafer 900 is returned to the growth reactor for growth of GaN:Si layer 210 and subsequent layers as in FIGS. 6 and 9. In this embodiment, GaN:Si layers 210 and 885 are doped to achieve an electron concentration of the order of $10^{18}/cm^3$ for high electrical conductivity. Individual laser diodes 830, 832, 834 and 836 are etched similarly as described above and shown in FIGS. 7a–7e.

N-metal contacts 810, 815, 820 and 825 (see FIGS. 8a and 8b) are formed by selectively removing the upper layers. Specifically, formation of n-metal contacts 815 and 820 requires selective removal of all layers down to n-GaN layer 210 and formation of n-metal contacts 810 and 825 requires selective removal of all layers down to n-GaN layer 885. Deposition of n-metal contacts 810, 815, 820 and 825 is performed by masking wafer 900 for contact metallization and lift-off patterning. N-metal contact pads 810, 815, 820 and 825 are typically Ti-Al while p-metal contact pads 816 or pad 817 are typically Ni—Au.

Laser Diode Arrays with Growth Substrate Removed

Removal of sapphire substrate 215 is useful for nitride laser diodes because removal of substrate 215 allows advantages that include realization of a vertical electrical contact structure, better heat sinking and mirror facets that are cleaved.

FIG. 10 shows the layer structure of dual spot InGaAlN laser diode structure 1000 grown on sapphire substrate 215 prior to removal of sapphire substrate 215. The layer structure is similar to the layer structure shown in FIG. 6. Isolation 1016 which may be silicon-oxy-nitride, silicon dioxide or silicon nitride separates multiple quantum well active regions 230 from each other and also electrically isolates other layers as shown in FIG. 10. Two p-contacts 1020 provide separate electrical contacts to the two laser diodes making up dual spot laser diode structure 1000. In order to be able to cleave facets, laser cavities in layer 230 need to be oriented perpendicular to the crystal planes of GaN layers 210, 665, 660, 650, 230, 640, 630, 620 and 610. Processing for dual spot laser diode structure 1000 is very similar to that described for laser diode structure 600 discussed above.

FIGS. 11a–11f schematically show the steps for removal of sapphire substrate 215 by laser liftoff and bonding of semiconductor membrane 1110 to thermally conductive substrate 1138 using supporting substrate 1105 in accordance with an embodiment of this invention. In accordance with an embodiment of this invention semiconductor membrane 1110 is typically an InGaAlN type film. Initially, backside 1115 of sapphire substrate 215 is polished to a very smooth surface finish to minimize light scattering of off backside 1115. Polishing is accomplished mechanically using a succession of diamond pads. During the polishing procedure, the diamond grit size is gradually reduced from a grid size of about 30 μm down to a grid size of 0.1 μm. Typical root mean square (rms) roughness after polishing is about 20–50 Angstrom.

Figure 11B:
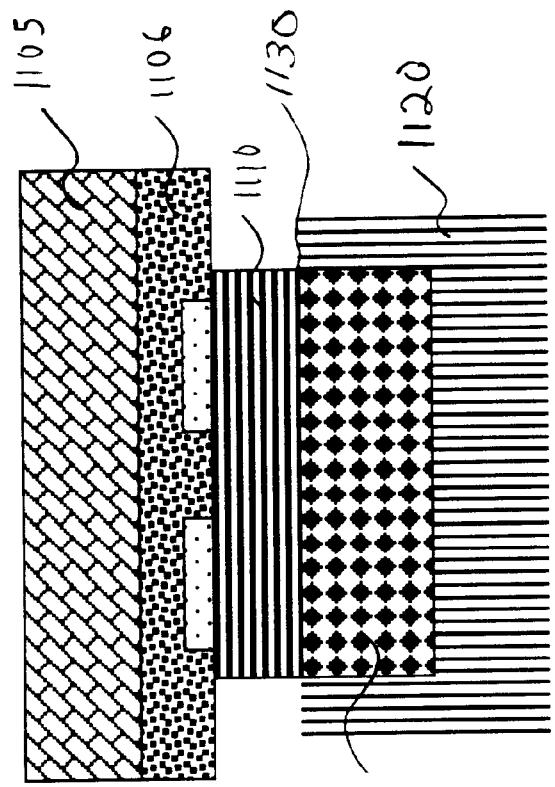
FIGS. 11a–11f show the steps for removing the sapphire growth substrate and adding a thermally conducting substrate to a dual spot laser structure in an embodiment in accordance with the present invention.
Figure 11A:
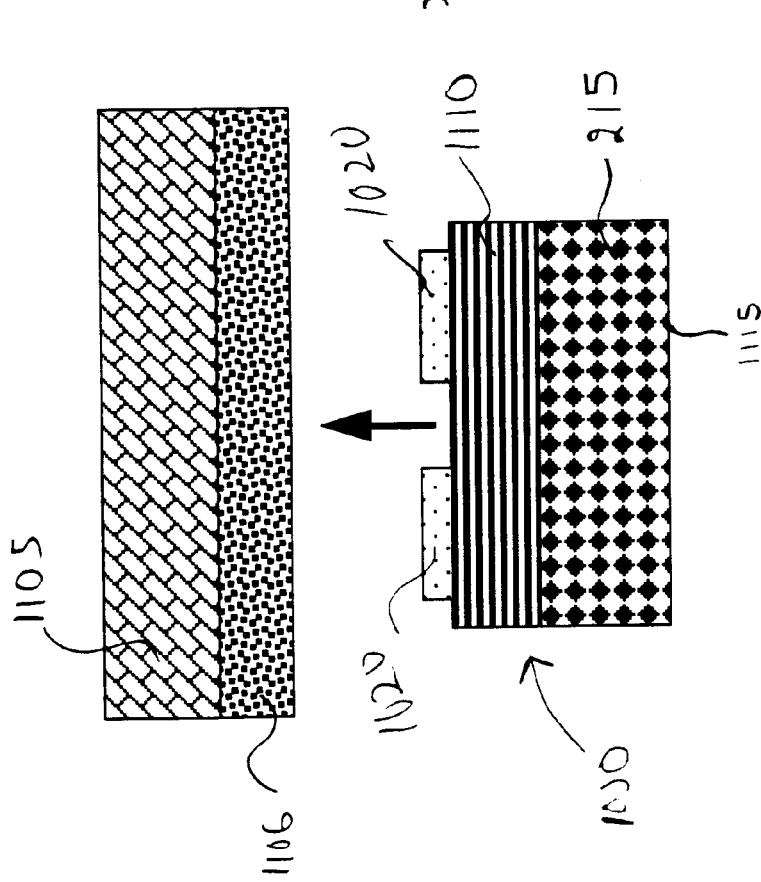

FIG. 11a shows mounting of dual spot laser diode structure 1000 to supporting substrate 1105 with wax or epoxy 1106 to provide support for semiconductor membrane 1110 after removal of sapphire substrate 215 and prior to bonding of substrate 1138 to semiconductor membrane 1110. FIG. 11b shows exposure of sapphire substrate 215 and semiconductor membrane 1110 to ultraviolet excimer laser light 1120. Proper adjustment of the excimer laser (not shown) allows decomposition of thin GaN layer 1130 at the interface between sapphire substrate 215 and semiconductor membrane 1110. GaN layer 1130 is decomposed into Ga metal and $N_2$. For an XeCl excimer laser operating at 308 nm the laser energy range should be from about 600–750 mJ/cm² with a beam size of 4 mm by 4 mm after passage through a homogenizer. A homogenizer converts a Gaussian-like laser beam to a flat plateau-like laser beam which provides improved beam uniformity. Larger areas may be exposed by scanning the laser beam across the area surface. The excimer laser is typically pulsed in the range of 5–10 Hz with one pulse typically being sufficient to achieve decomposition of GaN layer 1130. Polished backside 1115 allows uniform excimer laser exposure of GaN layer 1130.

Figure 11D:
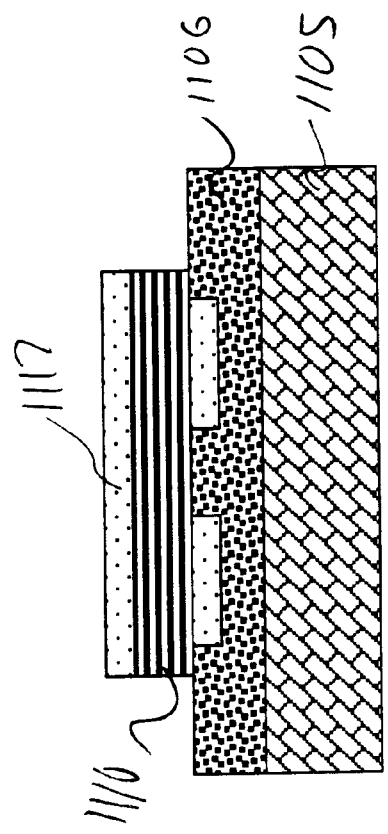
Figure 11C:
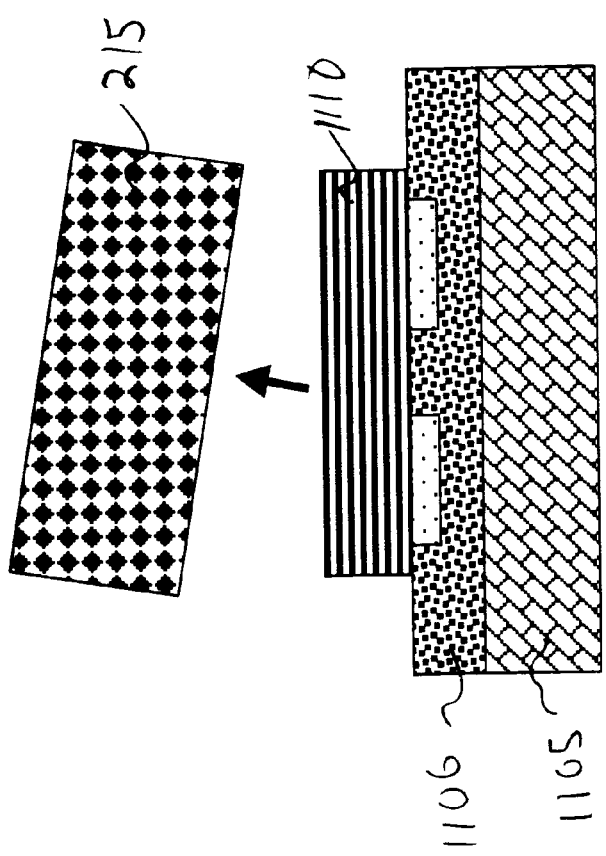

FIG. 11c shows separation of sapphire substrate 215 from semiconductor membrane 1110 at the interface by heating dual spot laser diode structure 1000 to approximately 30° C. which is the melting point for Ga metal. The residual Ga metal layer present on semiconductor membrane 1110 at the interface is removed with a hydrochloric acid (HCL) dip that is equal parts distilled water. Approximately 0.5 to 1 μm of the damaged film at the interface on semiconductor membrane 1110 is removed by dry-etching in a $Ar/Cl_2/BCl_3$ gas mixture. Typically, CAIBE or RIE is used for the dry-etch. Low energy (less than about 400 ev) Ar ion sputtering is employed after the dry-etch to reduce the surface damage caused by the dry-etching.

FIG. 11d shows deposition of n-metal layer 1117, typically titanium/aluminum, by thermal evaporation. Use of wax or epoxy layer 1106 does not allow n-metal layer 1117 to be alloyed since the melting point of wax or epoxy is typically well below the approximately 500° C. alloying temperature of n-metal layer 1117.

Figure 11F:
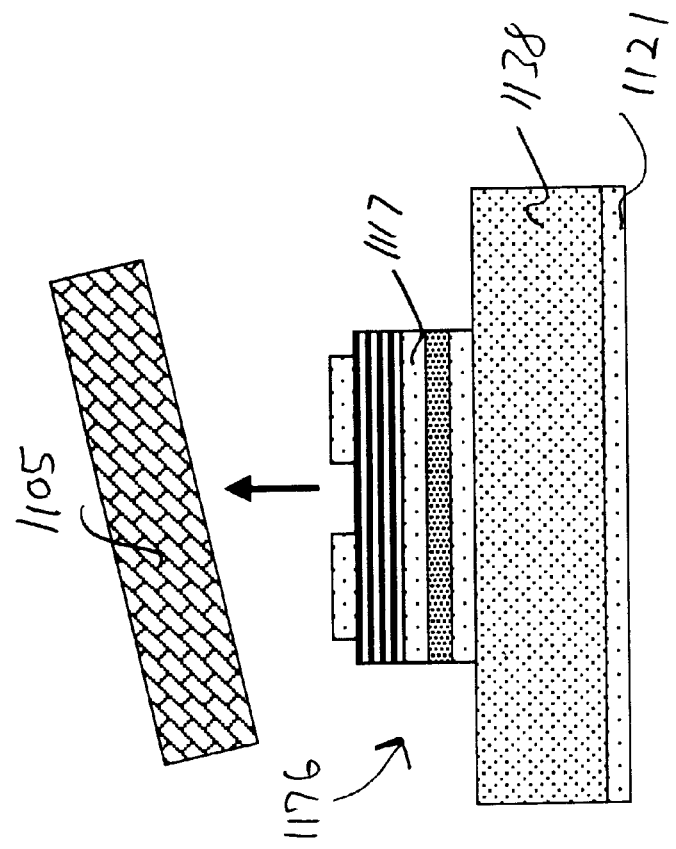
Figure 11E:
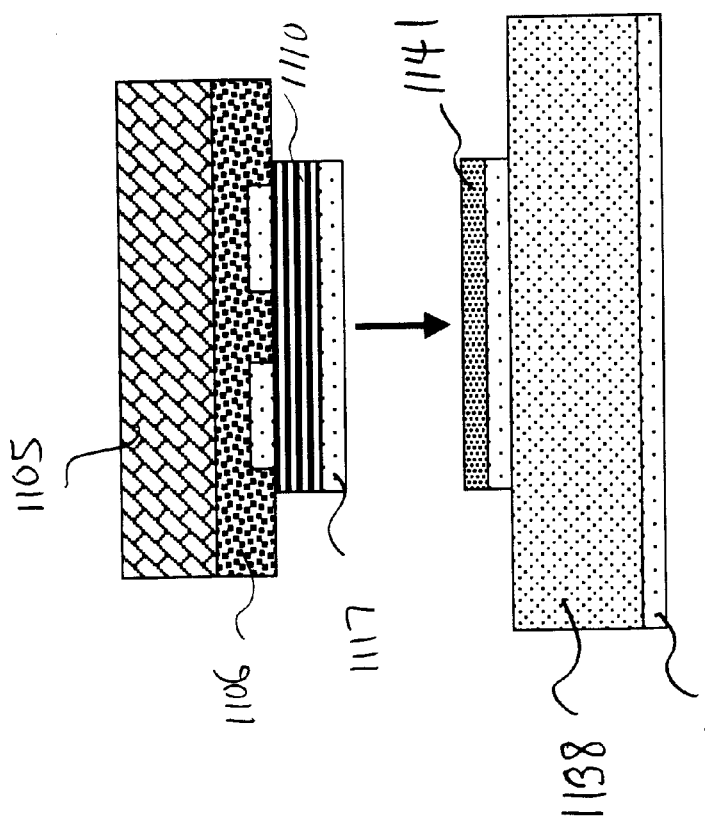

With reference to FIG. 11e, metal contact layer 1121, typically made of titanium/gold, is deposited by thermal or e-beam evaporation on substrate 1138 which typically is silicon, silicon carbide or diamond. Silicon is an economical substrate material that is electrically and thermally (about 1.5 W/cmK at room temperature and about 0.97 W/cmK at 100° C.) conductive and allows mirror cleaving and integration of a silicon driver chip with laser diodes. Silicon carbide is an expensive substrate material that is electrically and thermally (about 5 W/cmK at room temperature and about 3.2 W/cmK at 100° C.) conductive and allows mirror cleaving. Diamond is a very expensive substrate material that is the best known thermal conductor (about 20 W/cmK at room temperature and about 15.5 W/cmK at 100° C.) and can be metalized to be conductive while allowing mirror cleaving.

Another possible substrate material is copper which is very economical and a good thermal conductor (about 4 W/cmK). Mirror cleaving would not be possible with a copper substrate material and mirrors would need to be etched.

Deposition of solder layer 1141 which is, for example, In or PbSn, is performed to join substrate 1138 to semiconductor membrane 1110. Solder layer 1141 may typically have a Ti/Au film for better adhesion to substrate 1138 and a thin Au film may be applied to prevent oxidation of the exposed surface of solder layer 1141 prior to bonding. Deposition of metals occurs by thermal or e-beam evaporation with a typical film thickness of 1–2 μm.

Figure 12C:
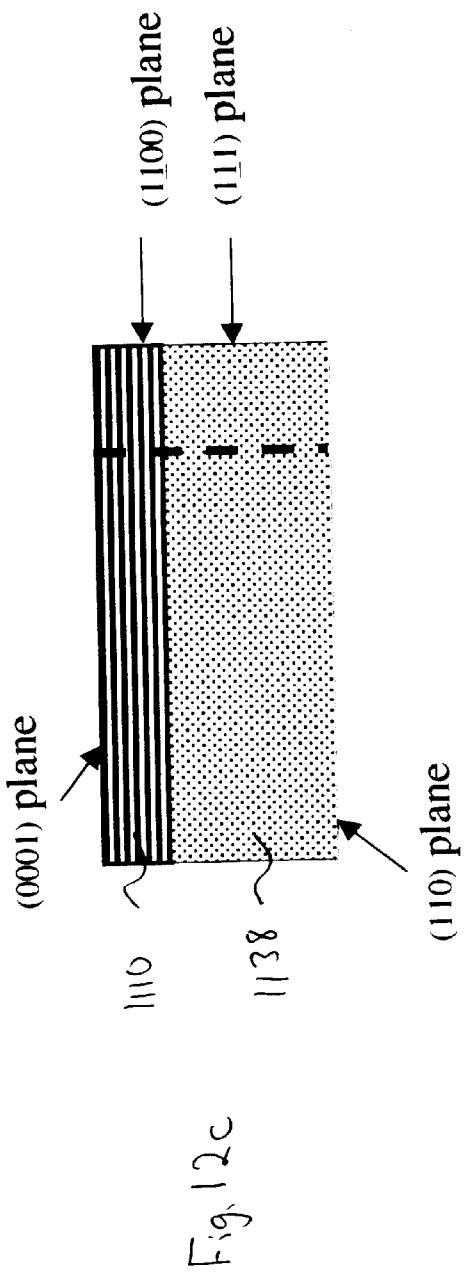
FIG. 12c shows crystal planes of silicon and InGaAlN membrane.
Figure 12D:
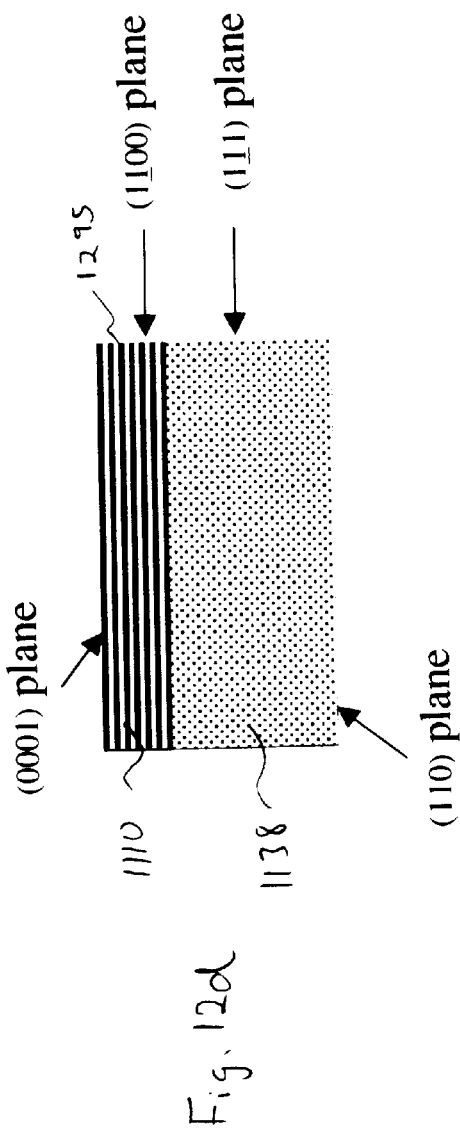
FIG. 12d shows cleaved facets in InGaAlN membrane in an embodiment in accordance with the present invention.

Prior to the flip chip bonding shown in FIG. 11e, the vertical crystal planes of semiconductor membrane 1110 need to be aligned with the appropriate crystal planes of silicon, silicon carbide or diamond substrate 1138 to allow for cleaving. FIG. 12a shows a desired alignment of the relevant crystal planes of semiconductor membrane 1110 and substrate 1138 prior to cleaving in accordance with an embodiment of this invention. Devices are cleaved along the {1100} planes of semiconductor membrane 1110 and the {111} planes of substrate 1138. FIG. 12b shows the relevant crystal planes of semiconductor membrane 1110 and substrate 1138 after cleaving. Cleaved facet 1295 is also shown. In accordance with an embodiment of this invention, FIG. 12*c* shows a desired alignment of the relevant crystal planes of semiconductor membrane 1110 and silicon substrate 1138 prior to cleaving. In FIG. 12*c,* the {111} crystal plane of silicon substrate 1138 is parallel to the {1100} crystal plane of semiconductor membrane 1110. This orientation allows an easier cleave of silicon substrate 1138 as seen in FIG. 12*d* which shows the relevant crystal planes of semiconductor membrane 1110 and substrate 1138 after cleaving.

After proper alignment of the relevant crystal planes of semiconductor membrane 1110 and substrate 1138, semiconductor membrane 1110 is bonded to substrate 1138. In accordance with an embodiment of this invention solder layer 1141 is used for bonding. Depending on the composition of solder layer 1141, solder layer 1141 and substrate 1138 are heated to the appropriate bonding temperature in a forming gas atmosphere to avoid oxide formation. A bonding temperature of about 180° C. is typically used when using In for solder layer 1141. If a Pd or Au film has not been deposited on the exposed surface of solder layer 1141, flux or a hydrochloric acid dip prior to heating may be used to remove any oxide present on the exposed surface of solder layer 1141. Other well-known techniques for oxide removal may also be used. When using PbSn for solder layer 1141, a bonding temperature of about 220° C. is typically used. Oxide may be removed as described above prior to bonding if an Au film has not been applied to the exposed surface of solder layer 1141.

In accordance with an embodiment of this invention, Au—Au thermo-compression bonding may be used to bond semiconductor membrane 1110 to substrate 1138. Au—Au thermo-compression bonding provides for better thermal contact between semiconductor membrane 1110 and substrate 1138. Note, solder layer 1141 is not present if Au—Au thermo-compression bonding is used to join substrate 1138 to semiconductor membrane 1110. A typical bonding temperature for Au—Au thermo-compression is about 350° C.

Bonded structure 1176 (see FIG. 11*f*) is cooled to about 20° C. while a bond load is applied. For example, the bond load used with In or PbSn solder is about 200 grams if the bonding area is 25 mm². If Au—Au thermo-compression bonding is used, the bond load is typically about 1500 g/mm². FIG. 11*f* shows removal of support substrate 1105 by dissolving wax or epoxy layer 1106 (see FIG. 11*e*) in acetone or other suitable solvent.

Cleaving of laser diode facets 1295 (see FIGS. 12*b* and 12*d*) is accomplished by propagating the cleave from the edge of silicon, silicon carbide or diamond substrate 1138 into semiconductor membrane 1110. Alternatively, laser diode facets 1295 may be dry-etched using CAIBE in an Ar/Cl$_2$/BCl$_3$ gas mixture. Laser diode facets 1295 are made reflective by deposition of SiO$_2$/TiO$_2$ high reflective coating using e-beam evaporation.

Figure 13:
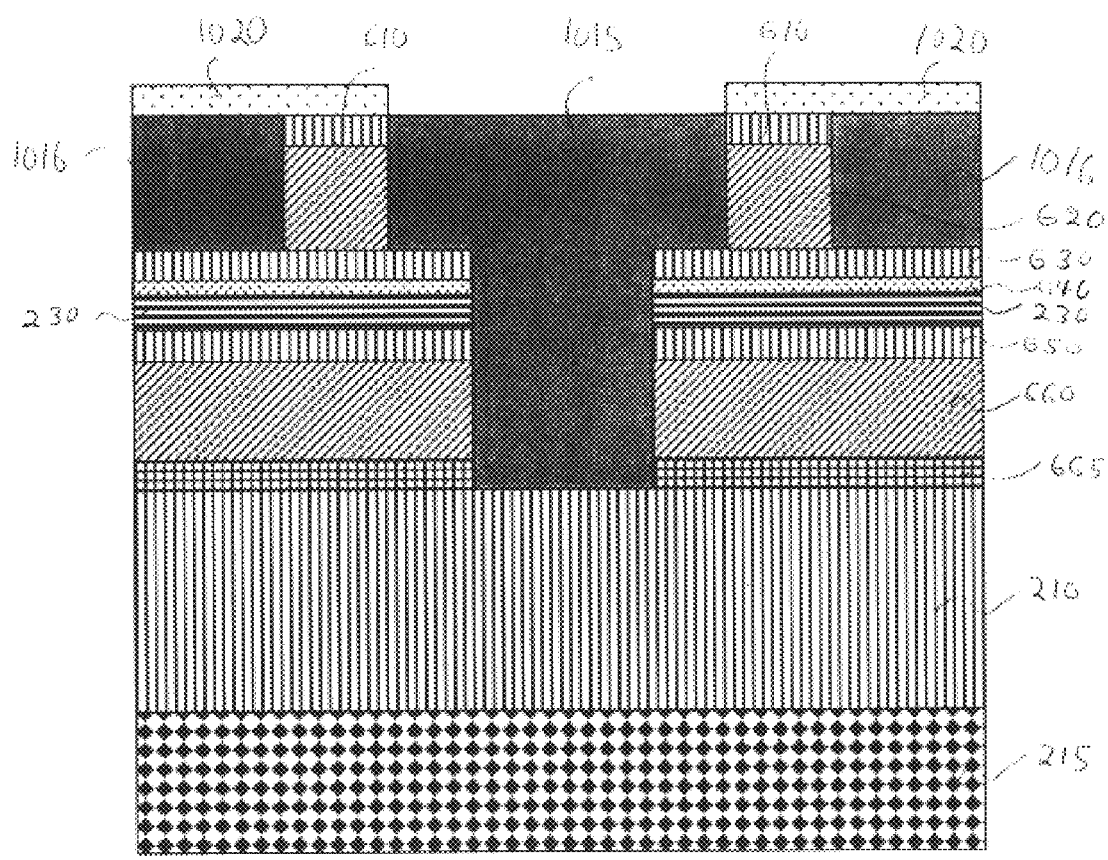
FIGS. 13a–13b show integration of a nitride laser array onto an electronic driver chip in an embodiment in accordance with the present invention.

FIG. 13*a* shows an embodiment in accordance with this invention wherein laser array 1350 of quad spot laser diode structures 1000 with substrate 215 (see FIG. 10) removed is integrated onto electronic driver chip 1310 which is typically a silicon based driver chip. In particular, FIG. 13*a* shows a cross-sectional view of laser array 1350 and field effect transistor 1320. Field effect transistor 1320 is used to switch current to laser diode structure 1000. After removal of sapphire substrate 215 (see FIG. 11*c*), semiconductor membrane 1110 is typically attached by solder as described above to electronic driver chip 1310. Prior to attachment, electronic driver chip 1310 has had driver circuit 1325 (see FIG. 13*b*) fabricated on it using well-known integrated circuit processing methods. Placement of laser array 1350 close to driver circuit 1325 allows rapid modulation of laser diodes 1000 to accommodate many laser channels. Hence, this embodiment is useful in printer applications where multibeam laser arrays 1350 are used and is likewise applicable to the area of parallel optical communications.

FIGS. 14*a*–14*f* schematically show the steps for bonding of semiconductor membrane 1110 to substrate 1138 using common p-contact 1422 and subsequent removal of sapphire substrate 215 by laser liftoff to make dual spot laser structure 1400 (see FIG. 14*f*) in accordance with this invention. Bonding substrate 1138 to semiconductor membrane 1110 on the side opposite to where sapphire substrate 215 is attached allows for superior heat sinking as thermally conductive substrate 1138 is only about 1 μm distant from active region 230 (see FIG. 10) as opposed to a 4–14 μm distance for the method and structure shown in FIGS. 11*a*–11*f*.

As described above, sapphire substrate 215 is polished to a very smooth surface finish to minimize the scattered light. Common p-contact 1422 is evaporated on substrate 1138 and then undergoes rapid thermal annealing in a nitrogen atmosphere and FIG. 14*a* shows common p-contact 1422 on substrate 1138. Typically, p-contact 1422 is Ti/Au.

Deposition of solder layer 1141, for example, In or PbSn, is performed to join substrate 1138 to semiconductor membrane 1110. Solder layer 1141 is not used if Au—Au thermo-compression bonding is used to join substrate 1138 to semiconductor membrane 1110. Solder layer 1141 may typically have a Ti/Au film for better adhesion to substrate 1138 resulting in layer 1141 being Ti/Au/In or Ti/Au/PbSn. A thin Au film may be applied to the exposed surface of solder layer 1141 prior to bonding to prevent oxidation. Deposition of metals occurs by thermal or e-beam evaporation with a typical film thickness of 1–2 μm.

After proper alignment of the relevant crystal planes of semiconductor membrane 1110 and substrate 1138 as described above, semiconductor membrane 1110 is bonded to substrate 1138. Substrate 1138 is typically silicon, silicon carbide or diamond. Depending on the composition of solder layer 1141, solder layer 1141 and substrate 1138 are heated to the appropriate bonding temperature in a forming gas atmosphere to avoid oxide formation. A bonding temperature of about 180° C. is typically used when using In for solder layer 1141. If a Pd or Au film has not been deposited on the exposed surface of solder layer 1141, flux or a hydrochloric acid dip prior to heating may be used to remove any oxide present on the exposed surface of solder layer 1141. Other well-known techniques for oxide removal may also be used. When using PbSn for solder layer 1141, a bonding temperature of about 220° C. is typically used. Oxide may be removed as described above prior to bonding if an Au film has not been applied to the exposed surface of solder layer 1141. If Au—Au thermo-compression bonding is used in place of solder layer 1140 in accordance with an embodiment of the invention, the typical bonding temperature is about 350° C.

Bonded laser structure 1410 (see FIG. 14*b*) is cooled to about 20° C. while a bond load is applied. For example, the bond load used with In or PbSn solder is about 200 grams if the bonding area is 25 mm². If Au—Au thermo-compression bonding is used, the bond load is 1500 g/mm². After bonding is complete, bonded laser structure 1410 is exposed to excimer laser light 1120 to decompose thin GaN layer 1141 at the interface between sapphire substrate 215 and semiconductor membrane 1110 forming Ga metal and N$_2$. Operating conditions for the excimer laser are identical to those described above with respect to FIG. 11*b*.

FIG. 14c show the liftoff of sapphire substrate 215 from semiconductor membrane 1110 by heating bonded laser structure 1410 to about 30° C. which is the melting point for Ga metal. The Ga metal is removed from the surface of semiconductor membrane 1110 using a hydrochloric acid (HCL) dip (HCL:H$_2$O=1:1). Approximately 0.5 to 1 μm of the damaged film at the interface on semiconductor membrane 1110 is removed by dry-etching in a Ar/Cl$_2$/BCl$_3$ gas mixture. Typically, CAIBE or RIE is used for the dry-etch. Low energy (less than about 400 ev) Ar ion sputtering is employed after the dry-etch to reduce the surface damage caused by the dry-etching.

After liftoff of sapphire substrate 215, backside mirror facets 1482 (see FIG. 14f) may be dry-etched using CAIBE or RIE in an Ar/Cl$_2$/BCl$_3$ gas mixture. Etching backside mirror facets 1482 allows bonded laser structure 1410 to be longer than the laser cavity length which is useful when it is difficult to cleave both front and backside facets with high yield for short length laser cavities. The increased length of laser structure 1410 also provides for a lower thermal resistance which is beneficial in preventing overheating of the laser cavity.

FIG. 14d shows deposited n-metal layer 1477. N-metal layer 1477 is typically Ti/Al and is deposited by thermal evaporation on semiconductor membrane 1110. If solder layer 1141 is In, PbSn or AuSn, for example, the melting point of solder layer 1141 is approximately in the range of 160–300° C. which prevents alloying of n-metal layer 1477 whose alloying temperature is about 500° C. To allow alloying of n-metal contact 1477, Au—Au or PdIn$_3$ bonding may be used instead of solder bonding. N-metal layer 1477 is alloyed using rapid thermal anneal in the range of 450–500° C. for about 5 minutes. Alloyed n-metal layer 1477 has a lowered contact resistance compared to unalloyed n-metal layer 1477. Devices with alloyed n-metal layer 1477 typically have operating voltages reduced by 1–2 volts compared to devices with unalloyed n-metal layer 1477. Subsequently, n-contact pad 1478 (see FIG. 14f), typically Ti/Au, is deposited over n-metal layer 1477 using thermal evaporation. The Au surface of n-contact pad 1478 functions as a bonding surface for wire bonding while the Ti bottom of n-contact pad 1478 is used to improve adhesion.

FIG. 14e shows creation of trench 1433 to separate n-metal layer 1477 and semiconductor membrane 1110 into two sections using dry-etching with CAIBE or RIE in an Ar/Cl$_2$/BCl$_3$ gas mixture. Front mirror facets 1481 are cleaved by propagating the cleave from the edge of substrate 1138 along line 1498 in FIG. 14f. Alternatively, front mirror facets 1481 may be fabricated using dry-etching with CAIBE or RIE in a Ar/Cl$_2$/BCl$_3$ gas mixture. Backside mirror facets 1482 are cleaved by propagating the cleave from the edge of substrate 1138 along line 1499 in FIG. 14f. Backside mirror facets 1482 may also be dry-etched using CAIBE or RIE in an Ar/Cl$_2$/BCl$_3$ gas mixture. SiO$_2$/TiO$_2$ high reflective coating is subsequently applied to front mirror facets 1481 and backside mirror facets 1482 using e-beam evaporation.

FIGS. 15a–15e schematically show the steps for bonding of semiconductor membrane 1110 to substrate 1138 using common n contact and removing sapphire substrate 215 by laser liftoff to make dual spot nitride laser structure 1500 (see FIG. 15e) in accordance with the present invention. Typically, substrate 1138 is silicon, silicon carbide or diamond, all of which provide heat sinking that is superior to the heat sinking provided by sapphire substrate 215. The thermal conductivity of sapphire is only about 0.46 W/cmK at room temperature and degrades to about 0.32 W/cmK at 100° C. As described above, backside 1115 of sapphire substrate 215 is polished to a very smooth surface finish to minimize scattered light.

FIG. 15a shows metal bonding layer 1522, typically Ti/Au, deposited on the backside of substrate 1138 before device packaging. Dielectric isolation layer 1509 is deposited on the front side of substrate 1138 using, for example, PECVD. Dielectric isolation layer 1509 is typically made up of silicon-oxy-nitride, silicon dioxide or silicon nitride material. If substrate 1138 is made insulating material such as diamond or semi-insulating SiC, dielectric isolation layer 1509 is not necessary. Metal contact pads 1530 are deposited on dielectric isolation layer 1509 or if substrate 1138 is insulating, deposition occurs on substrate 1138. Metal contact pads 1530 are typically Ti/Au film deposited by thermal or e-beam evaporation with the Ti film being 300 Angstrom thick and the Au film being 1–2 μm thick. Care needs to be taken in patterning metal contact pads 1530 such that the vertical crystal planes of semiconductor membrane 1110 are parallel to the appropriate crystal planes of substrate 1138 (see FIGS. 12a–12d) on assembly as shown in FIG. 15b to allow cleaving.

Patterned solder layers 1541 are deposited on metal contact pads 1530 to join substrate 1138 to semiconductor membrane 1110. Solder layers 1541 are not used if Au—Au thermo-compression bonding is used to join substrate 1138 to semiconductor membrane 1110. Solder layers 1541 may typically have a Ti/Au film for better adhesion to substrate 1138 resulting in layers 1541 being Ti/Au/In or Ti/Au/PbSn. A thin Au film may be applied to the exposed surface of solder layers 1541 prior to bonding to prevent oxidation. Deposition of metals occurs by thermal or e-beam evaporation with a typical film thickness of 1–2 μm.

Depending on the composition of solder layers 1541, solder layers 1541 and substrate 1138 are heated to the appropriate bonding temperature in a forming gas atmosphere to avoid oxide formation. A bonding temperature of about 180° C. is typically used when using In for solder layers 1541. If a Pd or Au film has not been deposited on the exposed surface of solder layers 1541, flux or a hydrochloric acid dip prior to heating may be used to remove any oxide present on the exposed surface of solder layers 1541. Other well-known techniques for oxide removal may also be used. When using PbSn for solder layers 1541, a bonding temperature of about 220° C. is typically used. If Au—Au thermo-compression bonding is used the typical bonding temperature is about 350° C. Oxide may be removed as described above prior to bonding if an Au film has not been applied to the exposed surface of solder layers 1541.

Bonded structure 1510 (see FIG. 15b) is cooled to about 20° C. while a bond load is applied. For example, the bond load used with In or PbSn solder is about 200 grams if the bonding area is 25 mm$^2$. If Au—Au thermo-compression bonding is used, the bond load is typically about 1500 grams/mm$^2$. Au—Au thermo-compression bonding typically requires much higher bond loads than solder bonding. Au—Au thermo-compression bonding provides an excellent thermal conductivity of about 3.18 W/cmK whereas In solder and PbSn solder have a thermal conductivity of about 0.87 W/cmK and 0.4 W/cmK, respectively. After bonding is complete, laser structure 1510 is exposed to excimer laser light 1120 to decompose thin GaN layer 1141 at the interface between sapphire substrate 215 and semiconductor membrane 1110 forming Ga metal and N$_2$. Operating conditions for the excimer laser are identical to those described above with respect to FIG. 11b.

Figure 15D:
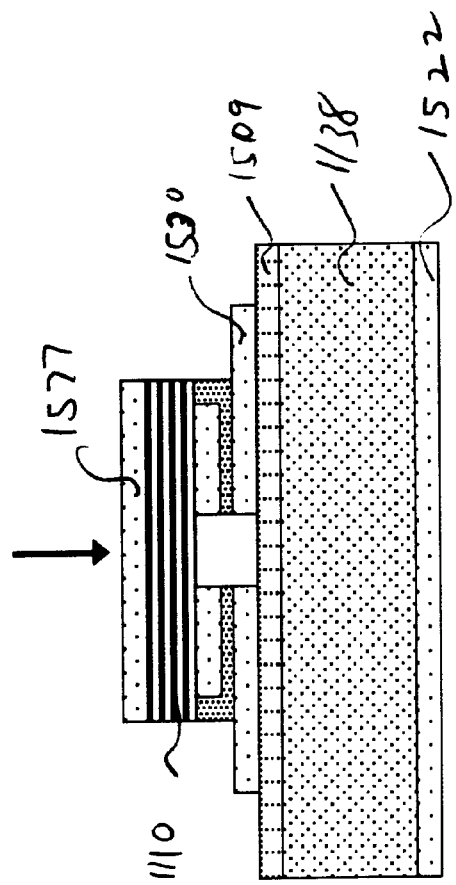
Figure 15C:
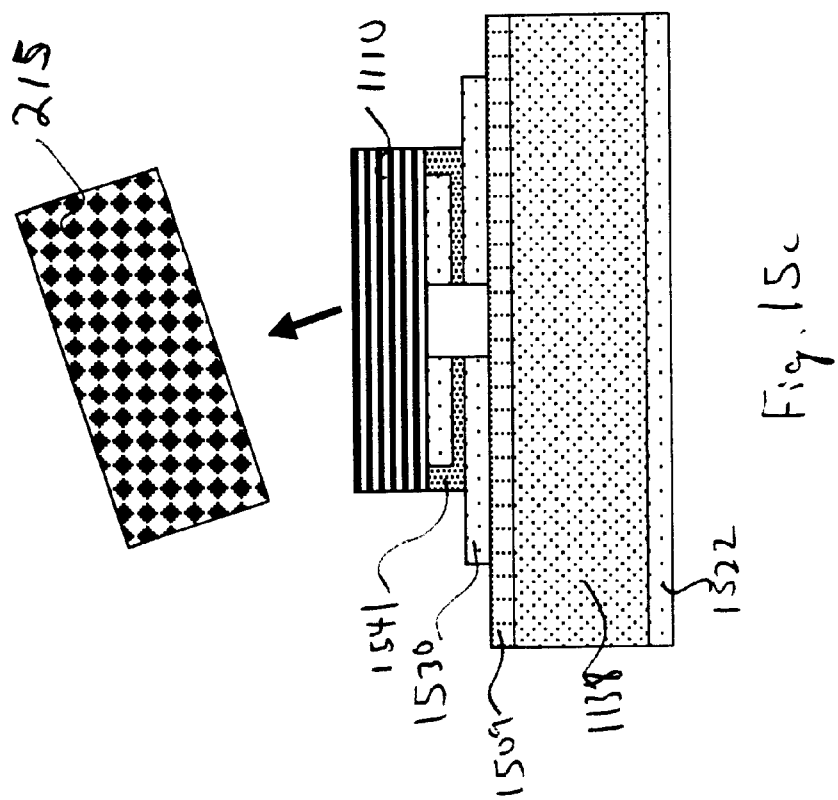

FIG. 15c show the liftoff of sapphire substrate 215 from semiconductor membrane 1110 by heating laser structure 1510 (see FIG. 15b) to about 30° C. which is the melting point for Ga metal. The Ga metal is removed from the surface of semiconductor membrane 1110 using a hydrochloric acid (HCL) dip (HCL:H$_2$O=1:1). Approximately 0.5 to 1 μm of the damaged film at the interface on semiconductor membrane 1110 is removed by dry-etching in a Ar/Cl$_2$/BCl$_3$ gas mixture. Typically, CAIBE or RIE is used for the dry-etch. Low energy (less than about 400 ev) Ar ion sputtering is employed after the dry-etch to reduce the surface damage caused by the dry-etching.

After liftoff of sapphire substrate 215, backside mirror facets 1582 (see FIG. 15e) may be dry-etched using CAIBE or RIE in an Ar/Cl$_2$/BCl$_3$ gas mixture. Etching backside mirror facets 1582 allows dual spot laser structure 1510 to be longer than the laser cavity length which is useful when it is difficult to cleave both front and backside facets with high yield for short length laser cavities. Having laser structure 1510 longer than the laser cavity length also provides for a lower thermal resistance which is beneficial in preventing overheating of the laser cavity.

FIG. 15d shows deposition of n-metal layer 1577 by thermal evaporation on semiconductor membrane 1110. N-metal layer 1577 is typically Ti/Al. If solder layers 1541 are In, PbSn or AuSn the melting point of solder layer 1541 is approximately in the range of 160–300° C. which prevents alloying of n-metal layer 1577 whose alloying temperature is about 500° C. To allow alloying of n-metal contact 1577, Au—Au or PdIn$_3$ bonding may be used instead of solder bonding. N-metal layer 1577 is alloyed using rapid thermal anneal in the range of 450–500° C. for about 5 minutes. As discussed above, alloyed n-metal layer 1577 has a lowered contact resistance compared to unalloyed n-metal layer 1577. Subsequently, n-contact pad 1578 (see FIG. 15e), typically Ti/Au, is deposited over n-metal layer 1577 using thermal evaporation. The Au surface of n-contact pad 1578 functions as a bonding surface for wire bonding while the Ti bottom of n-contact pad 1578 is used to improve adhesion.

Figure 15E:
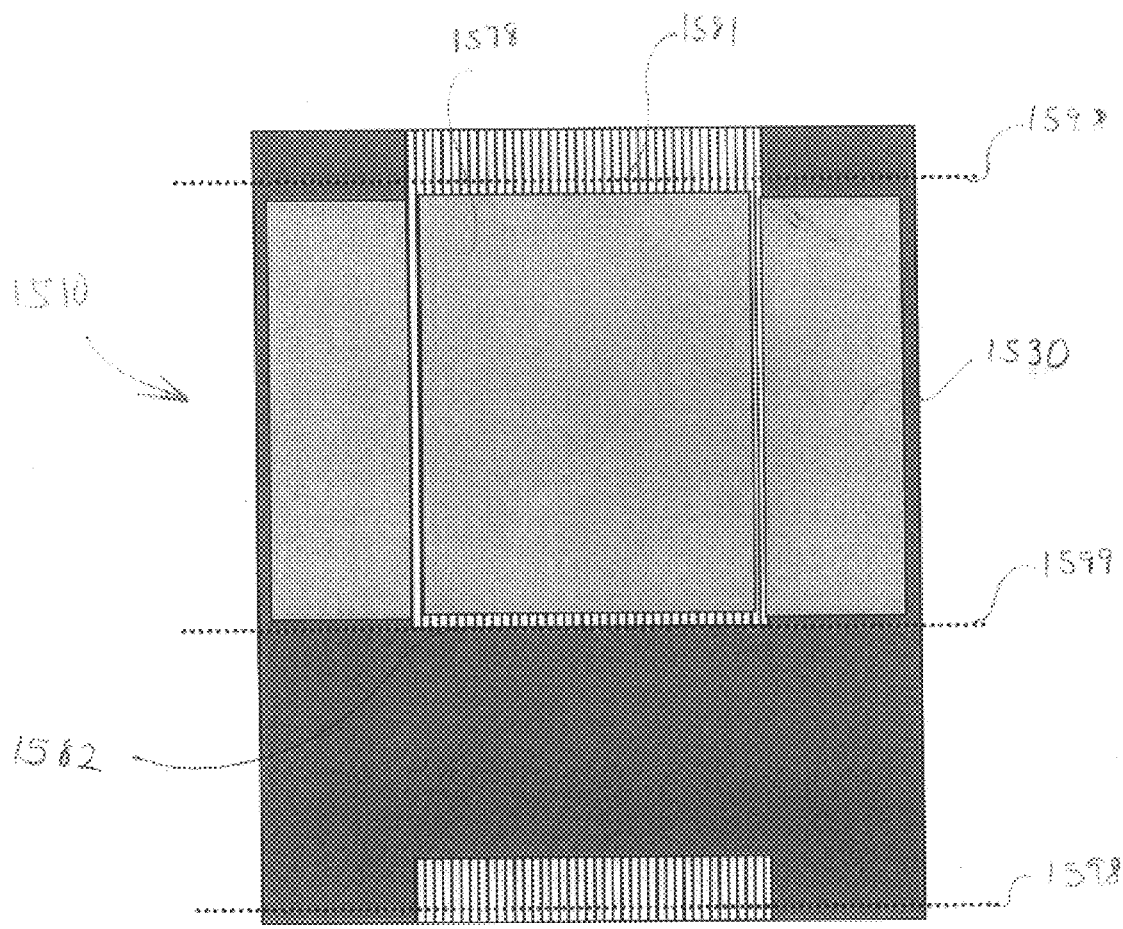

FIG. 15e shows dual spot laser structure 1510 in top view prior to cleaving of the wafer to create individual dual spot laser devices. Front mirror facets 1581 are cleaved by propagating the cleave from the edge of substrate 1138 (see FIGS. 12a–12d and FIG. 15a) along line 1598 in FIG. 15e. Alternatively, front mirror facets 1581 may be fabricated using dry-etching with CAIBE or RIE in a Ar/Cl$_2$/BCl$_3$ gas mixture. Backside mirror facets 1582 are cleaved by propagating the cleave from the edge of substrate 1138 (see FIGS. 12a–12d and FIG. 15a) along line 1599 in FIG. 15e. Backside mirror facets 1582 may also be dry-etched using CAIBE or RIE in an Ar/Cl$_2$/BCl$_3$ gas mixture. SiO$_2$/TiO$_2$ high reflective coating is subsequently applied to front mirror facets 1581 and backside mirror facets 1582 using e-beam evaporation.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for making a nitride laser diode array structure comprising the operations of:
   providing a semiconductor membrane having an insulating substrate attached on a first side of said semiconductor membrane;
   attaching a metallic interlayer to a second side of said semiconductor membrane;
   attaching a thermally conducting substrate to said metallic interlayer;
   removing said insulating substrate from said first side of said semiconductor membrane by exposing said insulating substrate to laser light; and
   placing a metal layer on said first side of said semiconductor membrane.

2. The method of claim 1 wherein said insulating substrate is comprised of sapphire.

3. The method of claim 1 wherein the metallic interlayer is a solder layer, the operation.

4. The method of claim 3 wherein said solder layer includes a material selected from the group consisting of In, PbSn, and AuSn.

5. The method of claim 1 wherein the operation of removing said insulating substrate includes polishing a surface of said insulating substrate prior to exposure to laser light of said surface.

6. The method of claim 1 wherein said semiconductor membrane is comprised of In, Ga, Al and N.

7. The method of claim 1 wherein said thermally conducting substrate includes a material selected from the group consisting of silicon, silicon carbide, copper and diamond.

8. A method for making a nitride laser diode array comprising the operations of:
   providing a semiconductor membrane having a first crystal plane, said semiconductor membrane having an insulating substrate attached to a first side of said semiconductor membrane and having a plurality of metal electrodes attached to a second side of said semiconductor membrane;
   attaching a thermally conducting substrate having a second crystal plane to said first side of said semiconductor membrane such that said first and said second crystal planes are aligned;
   removing said insulating substrate from said first side of said semiconductor membrane by exposing said insulating substrate to laser light; and
   placing a metal layer on said first side of said semiconductor membrane.

9. The method of claim 8 further comprising the operation of: cleaving said thermally conducting substrate along said second crystal plane and cleaving said semiconductor membrane along said first crystal plane to make facets in said laser diode array.

10. The method of claim 8 wherein said thermally conducting substrate is silicon.

11. The method of claim 10 wherein said second crystal plane is the {111} plane.

12. A method for making a nitride laser diode array comprising the operations of:
   providing a semiconductor membrane having a first crystal plane, said semiconductor membrane having an insulating substrate attached to a first side of said semiconductor membrane and having a plurality of metal electrodes attached to a second side of said semiconductor membrane;
   attaching a thermally conducting substrate having a second crystal plane to said first side of said semiconductor membrane such that said first and said second crystal planes are aligned;
   removing said insulating substrate from said first side of said semiconductor membrane by exposing said insulating substrate to laser light;
   placing a metal layer on said first of said semiconductor membrane, said trench dividing said metal layer and said semiconductor membrane into two separate sections.

* * * * *

UNITED STATES PATENT AND TRADEMARK OFFICE
CERTIFICATE OF CORRECTION

PATENT NO. : 6,448,102 B1  Page 1 of 1
APPLICATION NO. : 09/277328
DATED : September 10, 2002
INVENTOR(S) : Michael A. Kneissl et al.

It is certified that error appears in the above-identified patent and that said Letters Patent is hereby corrected as shown below:

Column 1, line 4, insert as a new paragraph:

This invention was made with Government support under 70NANB2H1241 awarded by DoC/SDL. The Government has certain rights in this invention.

Signed and Sealed this

Twenty-eighth Day of October, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,448,102 B1 | |
| APPLICATION NO. | : 09/277328 | |
| DATED | : September 10, 2002 | |
| INVENTOR(S) | : Michael A. Kneissl et al. | |

It is certified that error appears in the above-identified patent and that said Letters Patent is hereby corrected as shown below:

IN THE CLAIMS:

Column 14, line 9, claim 3, after the words "solder layer" and before "."
Delete ", the operation"

Signed and Sealed this
Fourteenth Day of February, 2012

David J. Kappos
*Director of the United States Patent and Trademark Office*